(12) United States Patent
Komninakis et al.

(10) Patent No.: US 9,041,464 B2
(45) Date of Patent: May 26, 2015

(54) CIRCUITRY FOR REDUCING POWER CONSUMPTION

(75) Inventors: Christos Komninakis, San Diego, CA (US); Vijay K. Chellappa, San Diego, CA (US); Jifeng Geng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 32 days.

(21) Appl. No.: 13/613,668

(22) Filed: Sep. 13, 2012

(65) Prior Publication Data

US 2013/0257529 A1    Oct. 3, 2013

Related U.S. Application Data

(60) Provisional application No. 61/535,871, filed on Sep. 16, 2011.

(51) Int. Cl.
| | |
|---|---|
| H03F 1/26 | (2006.01) |
| H03G 3/00 | (2006.01) |
| H03F 1/32 | (2006.01) |
| H03F 1/02 | (2006.01) |
| H03F 3/24 | (2006.01) |
| H04L 25/03 | (2006.01) |
| H04B 1/04 | (2006.01) |

(52) U.S. Cl.
CPC ............ *H03F 1/3241* (2013.01); *H03F 1/0244* (2013.01); *H03F 1/0266* (2013.01); *H03F 1/0272* (2013.01); *H03F 1/3247* (2013.01); *H03F 3/24* (2013.01); *H03F 2200/321* (2013.01); *H03F 2201/3233* (2013.01); *H04L 25/03343* (2013.01); *H04B 2001/0408* (2013.01)

(58) Field of Classification Search
USPC .......................................... 330/149, 127, 297
See application file for complete search history.

(56) References Cited

U.S. PATENT DOCUMENTS

| | | | |
|---|---|---|---|
| 5,420,536 A * | 5/1995 | Faulkner et al. ............... | 330/149 |
| 5,892,404 A | 4/1999 | Tang | |
| 6,043,707 A | 3/2000 | Budnik | |
| 6,081,161 A * | 6/2000 | Dacus et al. ................... | 330/297 |
| 6,141,541 A * | 10/2000 | Midya et al. .................... | 455/91 |

(Continued)

FOREIGN PATENT DOCUMENTS

WO         0030250 A1     5/2000

OTHER PUBLICATIONS

Chung S. et al., "Asymmetric Multilevel Out phasing Architecture for Multi-Standard Transmitters", Radio Frequency Integrated Circuits Symposium, 2009. RFIC 2009. IEEE, IEEE, Piscataway, NJ, USA, Jun. 7, 2009, pp. 237-240, XP031480266, ISBN : 978-1-4244-3377-3.

(Continued)

*Primary Examiner* — Patricia T Nguyen

(57) ABSTRACT

Circuitry for reducing power consumption is described. The circuitry includes a power amplifier. The circuitry also includes a predistorter coupled to the power amplifier. The circuitry further includes a power supply coupled to the power amplifier. The circuitry additionally includes a controller coupled to the power amplifier, to the predistorter and to the power supply. The controller captures a transmit signal and a feedback signal concurrently and determines a minimum bias voltage from a set of voltages and a predistortion that enable the power amplifier to produce an amplified transmit signal in accordance with a requirement.

34 Claims, 10 Drawing Sheets

(56) References Cited

U.S. PATENT DOCUMENTS

| | | | |
|---|---|---|---|
| 6,191,653 B1 | 2/2001 | Camp, Jr. et al. | |
| 6,531,860 B1 | 3/2003 | Zhou et al. | |
| 6,646,501 B1 * | 11/2003 | Wessel | 330/10 |
| 6,987,417 B2 * | 1/2006 | Winter et al. | 330/10 |
| 7,026,868 B2 * | 4/2006 | Robinson et al. | 330/10 |
| 7,091,780 B2 * | 8/2006 | Bienek et al. | 330/149 |
| 7,183,856 B2 | 2/2007 | Miki et al. | |
| 7,333,563 B2 | 2/2008 | Chan et al. | |
| 7,346,122 B1 | 3/2008 | Cao | |
| 7,427,897 B2 | 9/2008 | Hau et al. | |
| 7,715,811 B2 * | 5/2010 | Kenington | 455/127.1 |
| 7,741,903 B2 | 6/2010 | Vinayak et al. | |
| 7,741,906 B1 | 6/2010 | Summerfield | |
| 7,792,214 B2 * | 9/2010 | Matsuura et al. | 375/297 |
| 7,830,220 B2 * | 11/2010 | Ceylan et al. | 332/145 |
| 7,917,105 B2 * | 3/2011 | Drogi et al. | 455/126 |
| 8,090,051 B2 * | 1/2012 | Hoyerby et al. | 375/297 |
| 8,093,946 B2 | 1/2012 | Wimpenny et al. | |
| 8,160,519 B2 * | 4/2012 | Nentwig | 455/127.1 |
| 8,451,886 B2 * | 5/2013 | Vromans et al. | 375/238 |
| 8,536,940 B2 * | 9/2013 | Bohn et al. | 330/127 |
| 2008/0258831 A1 | 10/2008 | Kunihiro et al. | |
| 2009/0054018 A1 | 2/2009 | Waheed et al. | |
| 2010/0176885 A1 | 7/2010 | Kim et al. | |
| 2011/0063026 A1 | 3/2011 | Jung et al. | |
| 2011/0298539 A1 | 12/2011 | Drogi et al. | |
| 2013/0033314 A1 | 2/2013 | Gudem et al. | |

OTHER PUBLICATIONS

International Search Report and Written Opinion—PCT/US2012/055642—ISA/EPO—Nov. 19, 2011.

Tenbroek, et al., "Single-Chip Tri-Band WCDMA/HSDPA Transceiver without External SAW Filters and with Integrated Tx Power Control," 2008 IEEE International Solid-State Circuits Conference (Paper).

Tenbroek, et al.,"Single-Chip Tri-Band WCDMA/HSDPA Transceiver without External Saw Filters and with Integrated Tx Power Control," 2008 IEEE International Solid-State Circuits Conference (Powerpoint Presentation).

Hammi, et al., "On the Robustness of Digital Predistortion Function Synthesis and Average Power Tracking for Highly Nonlinear Power Amplifiers," IEEE Transactions on Microwave Theory and Techniques, vol. 55, Issue 6, pp. 1382-1389, 2007.

Idris, et al., "Design and Implementation of Self-Calibration for Digital Predistortion of Power Amplifiers," WSEAS Transactions on Circuits and Systems, vol. 7, Issue 2, pp. 75-84, 2008.

* cited by examiner

CIRCUITRY FOR REDUCING POWER CONSUMPTION

RELATED APPLICATIONS

This application is related to and claims priority from U.S. Provisional Patent Application Ser. No. 61/535,871 filed Sep. 16, 2011, for "SUPER-APT," which is hereby expressly incorporated by reference herein.

TECHNICAL FIELD

The present disclosure relates generally to electronic devices. More specifically, the present disclosure relates to circuitry for reducing power consumption.

BACKGROUND

In the last several decades, the use of electronic devices has become common. In particular, advances in electronic technology have reduced the cost of increasingly complex and useful electronic devices. Cost reduction and consumer demand have proliferated the use of electronic devices such that they are practically ubiquitous in modern society. As the use of electronic devices has expanded, so has the demand for new and improved features of electronic devices. More specifically, electronic devices that perform functions faster, more efficiently or with higher quality are often sought after.

Electronic devices may use one or more energy sources in order to function. Some electronic devices use portable energy sources, such as batteries. A desire for longer lasting batteries and concern for energy waste have led to the pursuit of more energy efficient electronic devices.

Thus, increasing energy efficiency in electronic devices is one current challenge. In particular, one difficulty in increasing energy efficiency in electronic devices is finding ways to make amplifiers operate more efficiently. As can be observed from this discussion, systems and methods that improve energy usage efficiency may be beneficial.

SUMMARY

Circuitry for reducing power consumption is described. The circuitry includes a power amplifier and a predistorter coupled to the power amplifier. The circuitry also includes a power supply coupled to the power amplifier. The circuitry further includes a controller coupled to the power amplifier, to the predistorter and to the power supply. The controller captures a transmit signal and a feedback signal concurrently and determines a minimum bias voltage from a set of voltages and a predistortion that enable the power amplifier to produce an amplified transmit signal in accordance with a requirement.

Determining the minimum bias voltage may include determining a power amplifier characteristic corresponding to a current bias voltage. Determining the minimum bias voltage may also include determining a next predistortion corresponding to a next bias voltage in the set of voltages. The next bias voltage may be lower than the current bias voltage. Determining the minimum bias voltage may further include estimating performance corresponding to the next bias voltage. The controller may iterate determining the next predistortion and estimating performance.

Estimating performance corresponding to the next voltage may include estimating one or more performance metrics corresponding to the next bias voltage. The one or more performance metrics may include adjacent channel leakage ratio (ACLR), adjacent channel power ratio (ACPR), peak-to-average ratio (PAR), error vector magnitude (EVM), receive band noise (RxBN), gain of an entire transmit chain and/or power of the entire transmit chain. The requirement may include a specified value for adjacent channel leakage ratio (ACLR), adjacent channel power ratio (ACPR), peak-to-average ratio (PAR), error vector magnitude (EVM), receive band noise (RxBN), gain of an entire transmit chain and/or power of the entire transmit chain.

The controller may determine whether the next bias voltage and the next predistortion enable the power amplifier to produce the amplified transmit signal in accordance with the requirement. The controller may also decrease the current bias voltage if the next bias voltage and the next predistortion enable the power amplifier to produce the amplified transmit signal in accordance with the requirement. The controller may additionally set at least one parameter if the next bias voltage and the next predistortion do not enable the power amplifier to produce the amplified transmit signal in accordance with the requirement.

Setting at least one parameter may include sending a parameter in a power supply control signal that indicates the current bias voltage. Setting at least one parameter may also include sending one or more parameters in a predistortion control signal that indicate predistortion corresponding to the current bias voltage.

The controller may determine whether reevaluation is needed based on one or more criteria. The controller may also determine whether a deficient performance occurs. The controller may set the current bias voltage to an initial voltage based on average power tracking (APT) if a deficient performance occurs.

Determining the next predistortion may include scaling the power amplifier characteristic to determine a next power amplifier characteristic corresponding to the next bias voltage. Determining the next predistortion may also include inverting the next power amplifier characteristic.

The controller may capture the feedback signal from an output of the power amplifier before a switch or duplexer. The controller may capture the feedback signal from an output of the power amplifier after a switch or duplexer.

A method for reducing power consumption by circuitry is also described. The method includes capturing a transmit signal and a feedback signal concurrently. The method also includes determining a minimum bias voltage from a set of voltages and a predistortion that enable a power amplifier to produce an amplified transmit signal in accordance with a requirement.

A computer-program product for reducing power consumption is also described. The computer-program product includes a non-transitory tangible computer-readable medium with instructions. The instructions include code for causing circuitry to capture a transmit signal and a feedback signal concurrently. The instructions also include code for causing the circuitry to determine a minimum bias voltage from a set of voltages and a predistortion that enable a power amplifier to produce an amplified transmit signal in accordance with a requirement.

An apparatus for reducing power consumption is also described. The apparatus includes means for capturing a transmit signal and a feedback signal concurrently. The apparatus also includes means for determining a minimum bias voltage from a set of voltages and a predistortion that enable a power amplifier to produce an amplified transmit signal in accordance with a requirement.

DETAILED DESCRIPTION

Figure 1:
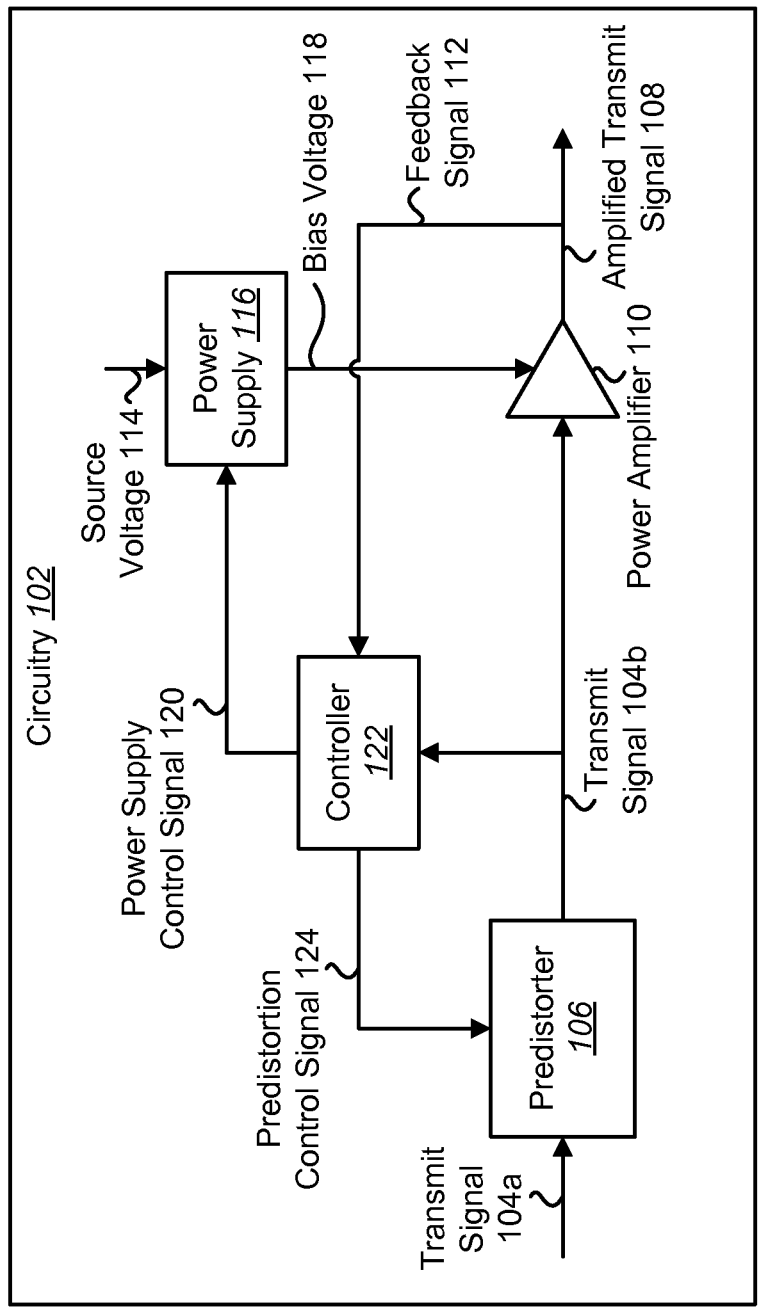
FIG. 1 is a block diagram illustrating one configuration of circuitry for reducing power consumption.

The systems and methods disclosed herein may be implemented in circuitry and/or on an electronic device. Examples of electronic devices include cellular phones, smartphones, laptop computers, desktop computers, netbooks, tablet devices, e-readers, personal digital assistants (PDAs), base stations, wireless routers, audio players (e.g., Moving Picture Experts Group-1 (MPEG-1) or MPEG-2 Audio Layer 3 (MP3) players), gaming consoles, portable gaming devices, video cameras, still cameras, televisions, integrated circuits, etc. In some configurations of the systems and methods disclosed herein, an electronic device may operate in accordance with one or more industry standards, such as Third Generation Partnership Project (3GPP) standards, 3GPP Long Term Evolution (LTE) standards, Global System for Mobile Communications (GSM), Universal Mobile Telecommunications System (UMTS), Institute of Electrical and Electronics Engineers (IEEE) 802.11 (e.g., "Wi-Fi") standards, IEEE 802.16 (e.g., Worldwide Interoperability for Microwave Access or "WiMAX") and others. While some of the systems and methods disclosed herein may be described in terms of one or more standards, this should not limit the scope of the disclosure, as the systems and methods may be applicable to many systems and/or standards.

As used herein, the terms "circuit," "circuitry" and other variations of the term "circuit" may denote a structural element or component. For example, circuitry can be an aggregate of circuit components, such as a multiplicity of integrated circuit components, in the form of processing and/or memory cells, units, blocks and/or other components.

It should be noted that the terms "couple," "coupling," "coupled" or other variations of the word couple as used herein may indicate either an indirect connection or a direct connection. For example, if a first component is "coupled" to a second component, the first component may be either indirectly connected (e.g., through another component) to the second component or directly connected to the second component. Additionally, it should be noted that as used herein, designating a component, element or entity (e.g., transistor, capacitor, resistor, power supply, circuit, block/module, etc.) as a "first," "second," "third" or "fourth" component may be used to distinguish components for explanatory clarity. It should also be noted that labels used to designate a "second," "third" or "fourth," etc. do not necessarily imply that elements using preceding labels "first," "second" or "third," etc. are included or used. For example, simply because an element or component is labeled a "third" component does not necessarily imply that "first" and "second" elements or components exist or are used. In other words, the numerical labels (e.g., first, second, third, fourth, etc.) are labels used for ease in explanation and do not necessarily imply a particular number of elements, a particular order or a particular structure. Thus, the components may be labeled or numbered in any manner.

It should be noted that the term "concurrent" and variations thereof may denote that two events may overlap in time and/or may occur near in time to each other. However, the term "concurrent" and variations thereof may or may not denote that two events occur at exactly the same time.

The systems and methods disclosed herein may be implemented to reduce power consumption. In some configurations, the systems and methods disclosed herein may reduce power consumption beyond known average power tracking (APT) schemes. For example, the systems and methods disclosed herein may utilize predistortion in order to reduce a bias voltage beyond that provided by known average power tracking (APT) schemes. This approach may be referred to as "super APT" or "SAPT."

Average power tracking (APT) may lower a power amplifier (PA) power supply bias voltage to improve efficiency. The systems and methods disclosed herein may utilize average power tracking (APT) in combination with predistortion to lower the bias voltage even further. In some configurations, the systems and methods disclosed herein may implement the following procedure.

The procedure may start at an initial voltage. In some configurations and/or instances, the initial bias voltage may be Vcc(0) based on average power tracking. In this case, the initial voltage (e.g., Vcc(0)) may be a "safe" bias voltage that is determined based on average power tracking (APT), for example. Additionally or alternatively, the initial voltage may be any other bias voltage that is deemed "safe" in terms of predicted performance requirements (e.g., adjacent channel leakage ratio (ACLR), receive band noise (RxBN), gain, etc.). The initial voltage may be updated or adjusted in some configurations and/or instances.

The procedure may concurrently capture a transmit signal and a feedback signal (from the power amplifier, for example). At step "i," the procedure may calculate a power amplifier (PA) characteristic at the current voltage Vcc(i). The procedure may design a new predistortion for a lower Vcc(i+1). The procedure may predict performance at the power amplifier (PA) output. The procedure may then iterate the two foregoing steps until a performance requirement is met at a lowest Vcc(i+1). The procedure may set one or more parameters. For example, the procedure may set an amplitude modulation-amplitude modulation (AMAM) and amplitude modulation-phase modulation (AMAM/AMPM) look-up table (LUT), baseband gains, radio transceiver (RTR) gains and Vcc(i+1). If needed (based on one or more criteria, for example), the procedure may return to concurrently capture the transmit signal and feedback signal. Furthermore, if unacceptable performance is detected, the procedure may return to start from the initial voltage Vcc(0).

More detailed steps in the procedure are given as follows. First, the procedure may start at an initial voltage (e.g., Vcc(0) based on average power tracking (APT) or any other bias voltage that is deemed "safe"). Vcc(0) may be a safe voltage established by basic average power tracking (APT). For example, basic average power tracking may establish a voltage that enables power amplifier performance to meet one or more requirements over varying frequency, temperature and parts. Thus, Vcc(0) may be a safe starting point and a safe fallback point in this procedure. It should be noted that although basic average power tracking (APT) may establish a voltage that enables power amplifier performance to meet one or more requirements (e.g., performance requirements) over varying frequency, temperature and parts, basic average power tracking (APT) may allow some margin between the established voltage and a minimum voltage where the one or more requirements may still be met. Thus, basic average power tracking (APT) alone may not be optimal in all cases and may leave some room for improvement in efficiency.

The procedure may concurrently capture a transmit signal and a feedback signal (e.g., power amplifier (PA) feedback signal). The transmit signal may be captured before or after predistortion. The feedback signal (e.g., "receive" signal) may be captured after the power amplifier (PA), before or after a duplexer and switch. Both the transmit signal and the feedback signal captures may be triggered at approximately the same time.

The procedure may calculate a power amplifier characteristic at a current voltage Vcc(i). For example, matching portions of the transmit signal and feedback signal (e.g., Tx/Rx signals) are extracted. In some configurations, for instance, frequency error correction, coarse matching, fine matching and/or equalization may be performed to extract matching portions of the transmit signal and the feedback signal. Phase correction and optional binning may also be performed. The procedure may utilize curve fitting to extract the AMAM/AMPM characteristic of the power amplifier.

The procedure may design a new predistortion for a lower Vcc(i+1). For example, a new predistortion may be designed for a lower Vcc(i+1) based on data feedback (e.g., one-shot data feedback and/or adaptive data feedback). In this context, one-shot data feedback may mean one record of in-phase and quadrature (IQ) data coupled from the power amplifier (e.g., transmitter), or one record of other parameter(s) dependent on this data, such as Peak-to-Average power Ratio (PAR) or Root Mean Square (RMS) power, etc. Adaptive data feedback may mean a continuously updated set of any of the foregoing. Additionally or alternatively, the new predistortion may be designed for the lower Vcc(i+1) based on a pre-stored factory calibration.

In one example, the power amplifier characteristic may be predicted at a reduced Vcc(i+1). In particular, this is an example of predicting the power amplifier AMAM in one shot. In this example, knowledge of a power amplifier saturation voltage (e.g., Vosat) and gains at various Vcc may be utilized to scale an AMAM curve to predict the power amplifier characteristic at Vcc(i+1). The predicted power amplifier characteristic may often match the measured characteristic rather well. In some configurations, a predistortion AMAM/AMPM look-up table (LUT) may then be designed (based on the predicted power amplifier characteristic, for instance). One example of designing a predistortion AMAM look-up table (LUT) (that may be part of a predistortion AMAM/AMPM LUT, for example) is described in connection with FIG. 6 below (where the AMAM output is assumed to be clipped at the value 2000, which is a maximum level (in least significant bits (LSBs) of the amplitude of that particular digital signal)).

The procedure may predict performance at the power amplifier output. For example, one or more performance measurements may be predicted (corresponding to the designed predistortion, for instance). In some configurations, one or more of the following performance metrics may be estimated (e.g., predicted): adjacent channel leakage ratio (ACLR), adjacent channel power ratio (ACPR), peak-to-average ratio (PAR), error vector magnitude (EVM), output power (e.g., Pout), receive band noise (RxBN), gain (of an entire transmit chain) and power (of an entire transmit chain). In one simulation of the systems and methods disclosed herein, for example, ACLR is approximately −43 dB decibels (dB), PAR=3.7 dB (which was slightly increased from the non-predistorted), EVM=1.8% and Pout=28.33 decibels referenced to a milliwatt (dBm). In this case, the predicted Pout was shown to be within ±0.1 dBm of the actual Pout. Furthermore, RxBN at 45 megahertz (MHz) was lower than specifications.

The procedure may iterate the two foregoing steps (e.g., designing a new predistortion and predicting performance) until one or more performance requirements are met for a lowest Vcc(i+1). These iteration steps may be performed (e.g., calculated) in software and/or firmware. In one example, Vcc(i+1)=3.05 volts (V) until a target ACLR is met. For instance, ACLR=−40 dB leaves some headroom for errors, while ACLR=−36 dB may leave little headroom for errors. Because performance at Vcc(i) may be measured through feedback, the amount of headroom left for predistortion may be known. In many cases, the systems and methods disclosed herein can achieve the target ACLR in one iteration.

The procedure may set one or more parameters. For example, an AMAM/AMPM look-up table (LUT), baseband gains, radio transceiver (RTR) gains and/or Vcc(i+1) may be set. If the predicted Pout is slightly off from target Pout, fine adjustment may be made to baseband gains.

The procedure may return to proceed from an earlier step in some cases. For example, the procedure may return to concurrently capture the transmit signal and the feedback signal as needed. For instance, the power amplifier characteristic may change over temperature and other variables. In some configurations, the procedure may return to concurrently capture the transmit signal and the feedback signal in order to track out any power amplifier changes based on one or more criteria. For example, the procedure may return on a periodic basis, based on elapsed time and/or based on a temperature change (e.g., increase) since the last transmit signal and feedback signal capture.

In another example, the procedure may return to start at the initial voltage (e.g., Vcc(0) from basic average power tracking (APT) or any other bias voltage that is deemed "safe") if unacceptable performance is detected. For example, if one or more performance requirements are not met, then the procedure may fall back to the beginning of the procedure (e.g., the procedure may re-start). In particular, Vcc(0) may be a voltage where one or more performance requirements may be met even over frequency, temperature and/or part variations. Additionally or alternatively, the initial bias voltage may be any other bias voltage that the algorithm has determined while decreasing the voltage (from Vcc(i) to Vcc(i+1), for example). At any of those steps, one or more calculations may deem a bias voltage "safe" in terms of having enough margin in the predicted performance requirement(s) (e.g., ACLR, RxBN, gain, etc.). Accordingly, the bias voltage (e.g., Vcc) utilized during that step may become the next "safe" fallback point. For instance, the initial voltage may be set to any bias voltage that is deemed "safe," where a "safe" bias voltage has a threshold amount of margin in one or more performance requirements.

Some features of the systems and methods are given as follows. The systems and methods may be applied as a one-time calibration after manufacturing and/or may be applied in the field (e.g., after manufacturing/calibration, when the device is in use). For example, the systems and methods described herein may be applied dynamically in some cases.

Average power tracking (APT) may lower a power amplifier bias voltage (e.g., Vcc) in order to improve efficiency. However, the systems and methods disclosed herein may apply average power tracking in conjunction with predistortion in order to lower the bias voltage (e.g., Vcc) even more. Thus, the systems and methods disclosed herein may utilize basic average power tracking (APT) as a safe starting point and as a safe fallback point, while gradually lowering the power amplifier bias voltage in order to improve power amplifier efficiency. Accordingly, the systems and methods disclosed herein may improve power amplifier efficiency by reducing a power amplifier bias voltage lower than that of basic APT and applying predistortion. For example, the systems and methods disclosed herein may improve amplifier (e.g., PA) efficiency by 4% more than basic average power tracking (APT). As a result, the systems and methods disclosed herein may reduce power consumption and heat.

It should be noted that some known predistortion schemes are based on factory calibration. However, these schemes offer static predistortion, which cannot track variations in a power amplifier characteristic due to temperature and/or frequency changes. In contrast, the systems and methods disclosed herein may dynamically track a power amplifier characteristic through feedback and may improve power amplifier efficiency more aggressively.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

FIG. 1 is a block diagram illustrating one configuration of circuitry 102 for reducing power consumption. The circuitry 102 includes a power amplifier 110, a predistorter 106, a controller 122 and a power supply 116. One or more of the elements or components included in the circuitry 102 (e.g., the predistorter 106, the controller 122, the power amplifier 110 and/or the power supply 116) may be implemented in hardware, software or a combination of both. For example, one or more of the elements or components included in the circuitry 102 may be implemented in circuitry, circuit components (e.g., resistors, transistors, capacitors, inductors, etc.), memory blocks, registers, processing blocks and/or in instructions (e.g., software code) stored in memory that are executed on a processor.

The power amplifier 110 may amplify a transmit signal 104. In some configurations, the power amplifier 110 may increase the amplitude of the transmit signal 104 for wireless transmission. The power amplifier 110 is coupled to the power supply 116. The performance of the power amplifier 110 may vary based on a bias voltage 118 that is provided by the power supply 116. For example, the magnitude of the amplification provided by the power amplifier 110 and/or the linearity of the power amplifier 110 may vary based on the bias voltage 118 provided.

The power supply 116 produces the bias voltage 118 based on a source voltage 114 and a power supply control signal 120 provided by the controller 122. One example of the power supply 116 is a switched mode power supply (SMPS). For instance, the power supply 116 may be a direct current-to-direct current (DC-to-DC) converter. The power supply 116 may reduce the source voltage 114 to a lower bias voltage 118. The source voltage 114 may be provided by a battery, a power adapter and/or some other source, for example.

The controller 122 is coupled to the power amplifier 110, to the power supply 116 and to the predistorter 106. The controller 122 controls the power supply 116 and the predistorter 106 based on the transmit signal 104 and a feedback signal 112. In particular, the controller 122 determines a minimum bias voltage 118 from a set of voltages and a predistortion that enable the power amplifier 110 to produce an amplified transmit signal 108 in accordance with a requirement (e.g., a performance requirement). For example, the controller 122 may determine this minimum bias voltage 118 that enables the power amplifier 110 to produce an amplified transmit signal 108 in accordance with one or more of the methods 200, 300 described in connection with FIGS. 2-3 below.

The controller 122 provides the power supply control signal 120 to the power supply 116. The power supply control signal 120 may cause the power supply 116 to produce a particular bias voltage 118. For example, the power supply control signal 120 may include one or more parameters that correspond to or indicate a particular bias voltage 118.

The controller 122 may cause the power supply 116 to produce a bias voltage 118 from a set of voltages. The set of voltages may include one or more voltages. For example, the set of voltages may comprise a finite set of discrete voltages that the controller 122 may cause the power supply 116 to produce. In some cases, the set of voltages may be limited by a resolution of the controller 122, the power supply 116 or both. For example, the power supply control signal 120 may be represented with a finite number of bits, indicators or parameters. Accordingly, the controller 122 may indicate bias voltages 118 based on a finite number of steps or a finite number of values. Thus, the minimum bias voltage 118 from the set of voltages that enables the power amplifier 110 to produce an amplified transmit signal 108 in accordance with one or more requirements may be the lowest possible voltage in the set of voltages where the requirement(s) are still met. Accordingly, a next lower voltage in relation to this minimum bias voltage 118 in the set of voltages (if one exists) would not enable the power amplifier 110 to produce an amplified transmit signal 108 in accordance with the requirement(s).

The controller 122 also provides a predistortion control signal 124 to the predistorter 106. The predistortion control signal 124 may cause the predistorter 106 to apply a particular predistortion to the transmit signal 104a. For example, the predistortion control signal 124 may include one or more parameters that indicate a particular predistortion. In some configurations, the predistortion control signal 124 may indicate an AMAM/AMPM look-up table (LUT) that defines the predistortion. Additionally or alternatively, the predistortion control signal 124 may include one or more parameters that functionally define the predistortion (e.g., based on one or more of a polynomial function, volterra model, piecewise function, etc.).

The predistorter 106 is coupled to the controller 122 and to the power amplifier 110. The predistorter 106 may apply predistortion to a transmit signal 104a. For example, the predistorter 106 applies predistortion specified by the predistortion control signal 124. Applying predistortion to the transmit signal 104 may enable the power amplifier 110 to operate with a lower bias voltage 118 while still producing an amplified transmit signal 108 that meets one or more requirements. Examples of the one or more requirements include one or more specified values for adjacent channel leakage ratio (ACLR), adjacent channel power ratio (ACPR), peak-to-average ratio (PAR), error vector magnitude (EVM), output power (e.g., Pout), receive band noise (RxBN), gain the entire transmit (Tx) chain and/or power of the entire transmit (Tx) chain. For example, gain or power may be equivalent from the transmit point of view. If the gain is known, for instance, then knowing the transmit signal (e.g., transmit signal 104) that the baseband transmitter generates may enable prediction of the output power of the device (e.g., circuitry 102).

Figure 2:
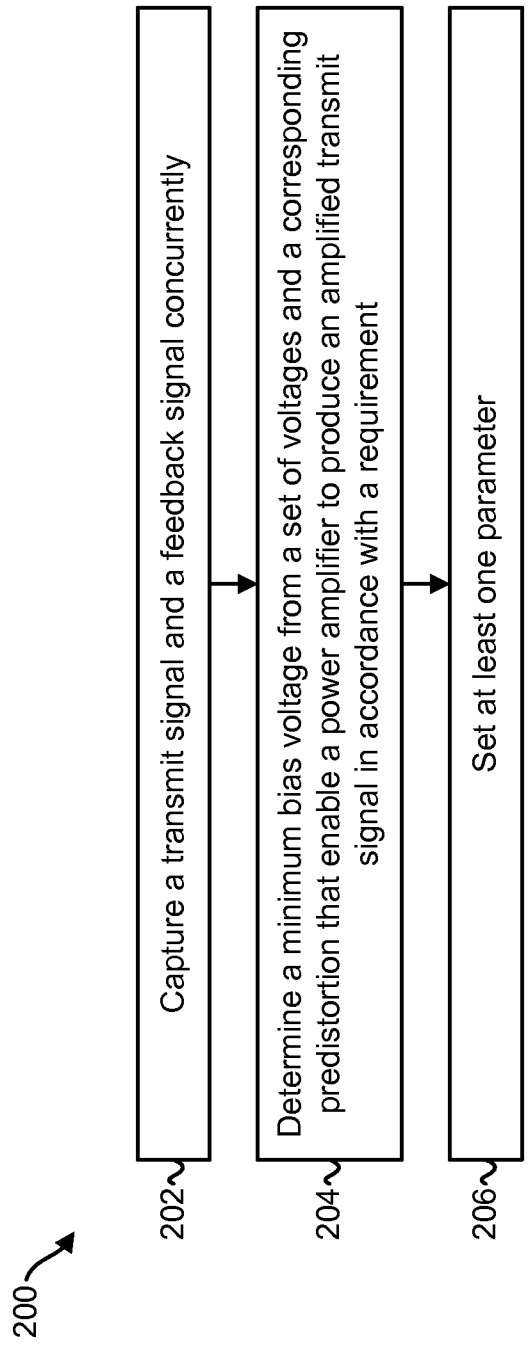
FIG. 2 is a flow diagram illustrating one configuration of a method for reducing power consumption by circuitry.

FIG. 2 is a flow diagram illustrating one configuration of a method 200 for reducing power consumption by circuitry 102. The circuitry 102 may capture 202 a transmit signal 104 and a feedback signal 112 concurrently. In one example, the controller 122 captures the transmit signal 104 and the feedback signal 112 in overlapping time periods.

The circuitry 102 may determine 204 a minimum bias voltage 118 from a set of voltages that enables a power amplifier 110 to produce an amplified transmit signal 108 in accordance with a requirement. For example, the controller 122 determines a power amplifier characteristic corresponding to a current voltage. The controller 122 also determines predistortion for a next (e.g., lower) voltage in a set of voltages and estimates performance corresponding to this next voltage. The controller 122 may further iterate determining predistortion and estimating performance in an attempt to determine the minimum bias voltage 118 from the set of voltages that enables the power amplifier 110 to produce the amplified transmit signal 108 in accordance with the requirement.

The circuitry 102 may set 206 at least one parameter. For example, the controller 122 sends one or more parameters in the predistortion control signal 124 that indicate or define the predistortion to be applied by the predistorter 106 to the transmit signal 104. For instance, the predistortion control signal 124 may indicate an AMAM/AMPM look-up table (LUT) that defines the predistortion. The controller 122 may also send a parameter in the power supply control signal 120 that indicates the minimum bias voltage 118 determined 204. In some configurations, the circuitry 102 (e.g., controller 122) may set one or more additional parameters, such as one or more baseband gains and/or one or more radio transceiver (RTR) gains.

The circuitry 102 may predistort and amplify the transmit signal 104 in accordance with the set 206 parameter(s). The circuitry 102 may also transmit the resulting amplified transmit signal 108.

Figure 3:
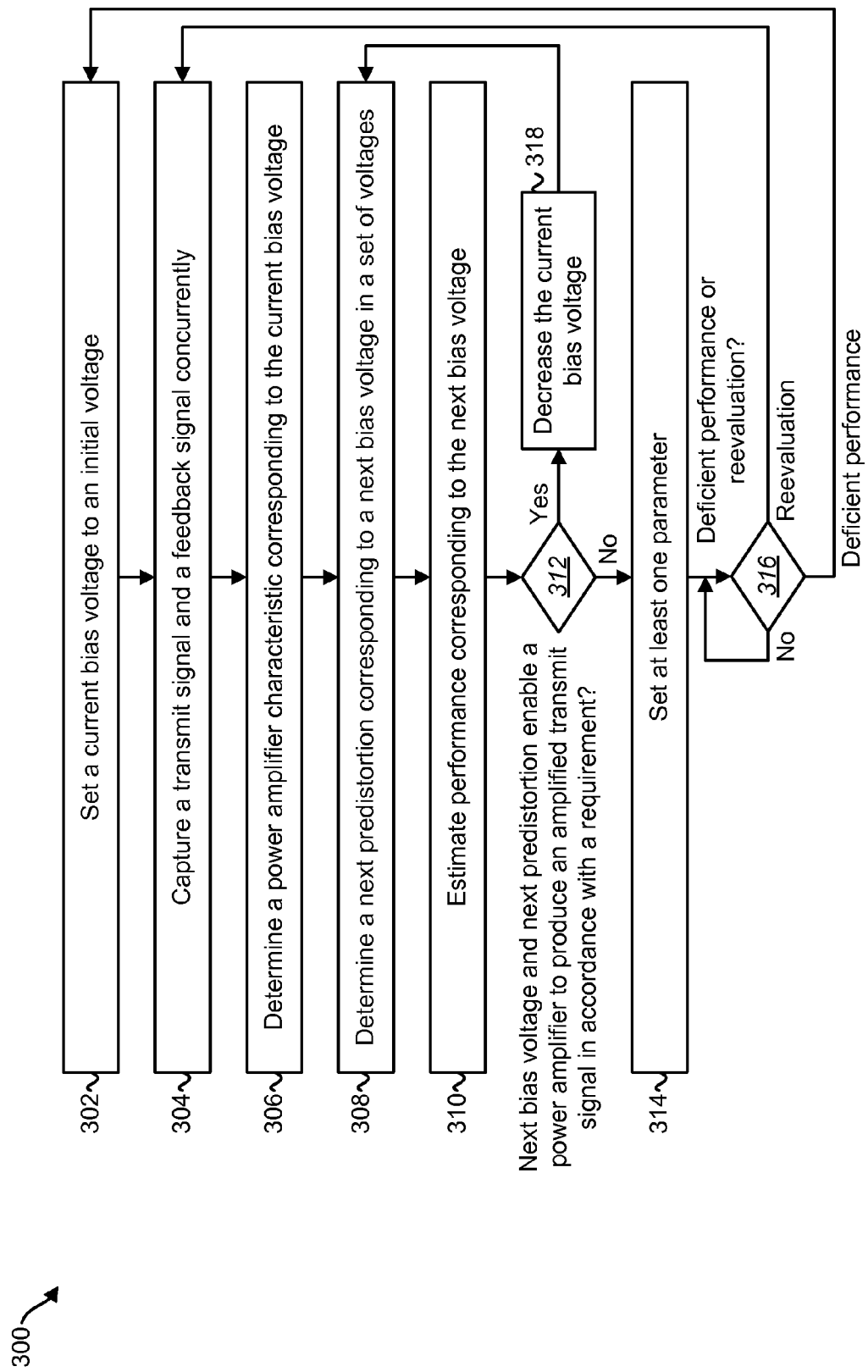
FIG. 3 is a flow diagram illustrating a more specific configuration of a method for reducing power consumption by circuitry.

FIG. 3 is a flow diagram illustrating a more specific configuration of a method 300 for reducing power consumption by circuitry 102. The circuitry 102 may set 302 a current bias voltage 118 (e.g., Vcc(i)) to an initial voltage (e.g., Vcc(0)). In one example, the circuitry 102 causes the power supply 116 to produce a current bias voltage 118 at this initial voltage.

In some configurations, the circuitry 102 may perform basic average power tracking (APT) in order to determine the initial voltage. As described above, this initial voltage may enable the circuitry 102 (e.g., power amplifier 110) to produce an amplified transmit signal 108 in accordance with one or more requirements over variations in temperature, frequency and/or parts. However, in some cases, this initial voltage may be higher than a minimum voltage in a set of voltages that enables the power amplifier 110 to produce the amplified transmit signal 108 in accordance with the one or more requirements. Thus, the initial voltage may be less efficient and may waste power.

The circuitry 102 may capture 304 a transmit signal 104 and a feedback signal 112 concurrently. For example, the controller 122 captures 304 the transmit signal 104 and the feedback signal 112 in overlapping time periods. More specifically, the circuitry 102 (e.g., controller 122) may trigger a capture 304 of the transmit signal 104 and of the feedback signal 112 at approximately the same time. In some configurations, the circuitry 102 (e.g., controller 122) captures 304 the transmit signal 104$b$ after the (output of the) predistorter 106. In other configurations, the circuitry 102 (e.g., controller 122) captures 304 the transmit signal 104$a$ before the (input of the) predistorter 106.

The feedback signal 112 is captured 304 after the power amplifier 110. In some configurations, the circuitry 102 (e.g., controller 122) may capture 304 the feedback signal 112 before a duplexer and switch (not illustrated in FIG. 1). In other configurations, the circuitry 102 (e.g., controller 122) may capture 304 the feedback signal 112 after a duplexer and switch (not illustrated in FIG. 1).

The circuitry 102 may determine 306 a power amplifier characteristic corresponding to the current bias voltage (e.g., Vcc(i), where i is an index that denotes the current bias voltage). For example, the circuitry 102 (e.g., controller 122) determines 306 the power amplifier characteristic based on the captured 304 transmit signal 104 and feedback signal 112 that correspond to the current bias voltage. The power amplifier characteristic may indicate the response (e.g., output voltage (e.g., Vout) versus input voltage (e.g., Vin)) of the power amplifier at the current bias voltage. The response may illustrate the linearity of the power amplifier (e.g., the range of voltages over which the power amplifier characteristic is approximately linear).

In some configurations, the circuitry 102 (e.g., controller 122) determines 306 the power amplifier characteristic as follows. The controller 122 extracts matching signals from the captured 304 transmit signal 104 and feedback signal 112. For example, the controller 122 performs one or more of frequency error correction, phase correction coarse matching, fine matching and equalization in order to extract matching signals. The controller 122 also performs phase correction and optionally performs binning and averaging, curve-fitting and/or any other equivalent method of data reduction in order to determine 306 the power amplifier characteristic (e.g., an AMAM/AMPM characteristic of the power amplifier 110).

The circuitry 102 (e.g., controller 122) may determine 308 a next predistortion corresponding to a next bias voltage (e.g., Vcc(i+1)) in a set of voltages. The next bias voltage (e.g., Vcc(i+1)) may be a lower voltage (than the current bias voltage) in the set of voltages. This next predistortion is determined 308 based on data feedback and/or a pre-stored calibration. In some configurations, for example, a calibration may be performed in advance that determines a relationship of Vosat (of the power amplifier 110) versus the bias (e.g., supply) voltage Vcc. The calibration results may be pre-stored on the device. The data feedback may be one-shot or adaptive.

One example of determining 308 (e.g., predicting) the predistortion in one shot is described as follows. The controller 122 scales the determined 306 power amplifier characteristic (e.g., an AMAM curve corresponding to the current voltage Vcc(i)) based on a saturation voltage (e.g., Vosat) and gains at various bias voltages (e.g., Vcc) in order to determine (e.g., predict) a next power amplifier characteristic corresponding to the next bias voltage (e.g., Vcc(i+1)). The controller 122 then inverts the next power amplifier characteristic corresponding to the next voltage in order to determine 308 the predistortion.

The circuitry 102 (e.g., controller 122) may estimate 310 performance corresponding to the next bias voltage (e.g., Vcc(i+1)). For example, the controller 122 estimates one or more performance metrics corresponding to the next bias voltage (e.g., Vcc(i+1)). Estimating 310 performance (e.g., one or more performance metrics) may also be based on the determined 308 next predistortion corresponding to the next voltage. Examples of the one or more performance metrics include adjacent channel leakage ratio (ACLR), adjacent channel power ratio (ACPR), peak-to-average ratio (PAR), error vector magnitude (EVM), output power (e.g., Pout), receive band noise (RxBN) and gain.

The circuitry 102 (e.g., controller 122) may iterate determining 308 a next predistortion corresponding to a next bias voltage in a set of voltage and estimating 310 performance corresponding to the next bias voltage in an attempt to determine a minimum bias voltage from the set of voltages and a predistortion that enable the power amplifier to produce an amplified transmit signal in accordance with one or more requirements are determined. In some configurations, iterating may be carried out as follows.

The circuitry 102 (e.g., controller 122) may determine 312 whether the next bias voltage (e.g., Vcc(i+1)) and a corresponding predistortion enable a power amplifier 110 to produce an amplified transmit signal 108 in accordance with a requirement. For example, the controller 122 determines whether the next voltage (e.g., Vcc(i+1)) and the corresponding predistortion enable the power amplifier 110 to produce an amplified transmit signal 108 that satisfies one or more performance requirements. In some configurations, this determination 312 may be made by comparing estimated 310 performance corresponding to the next bias voltage (e.g., Vcc(i+1)) to one or more performance targets. For instance, the circuitry 102 (e.g., controller 122) may compare one or more performance metrics to one or more performance targets for adjacent channel leakage ratio (ACLR), adjacent channel power ratio (ACPR), peak-to-average ratio (PAR), error vector magnitude (EVM), output power (e.g., Pout), receive band noise (RxBN) and/or gain. In these configurations, if the estimated 310 performance metric(s) meet the performance target(s), then the next bias voltage and a corresponding predistortion enable the power amplifier 110 to produce an amplified transmit signal in accordance with a requirement. Otherwise, the next bias voltage and the corresponding predistortion do not enable the power amplifier 110 to produce an amplified transmit signal in accordance with a requirement.

If the next bias voltage (e.g., Vcc(i+1)) in the set of voltages and the corresponding predistortion enable the power amplifier 110 to produce an amplified transmit signal 108 in accordance with a requirement, then the circuitry 102 (e.g., controller 122) may proceed to a next iteration or return to determining 308 predistortion and estimating 310 performance corresponding to one or more subsequent (e.g., lower) voltages in the set of voltages. For example, the circuitry 102 (e.g., controller 122) may decrease 318 the current bias voltage and return to determining 308 predistortion corresponding to a next bias voltage in the set of voltages. For instance, the index i may be incremented (e.g., i=i+1). In other words, the index i may be incremented while the bias voltage Vcc(i+1)<Vcc(i), for example. It should be noted that decreasing 318 the current bias voltage may not actually set or update the bias voltage 118. For example, the controller 122 may not send a parameter in the power supply control signal 120 to set the bias voltage 118 until it is set 314.

For clarity, decreasing 318 the current bias voltage may be performed in accordance with the following example. The "new" current voltage (e.g., Vcc(i)) may be decreased to (e.g., set to) the "old" next voltage (e.g., the previous Vcc(i+1)) from the previous iteration. In this case, the "new" next voltage (e.g., the new Vcc(i+1)) is the subsequent (e.g., lower) voltage in the set of voltages (if a subsequent voltage in the set exists, for example). Thus, the circuitry 102 may determine 308 predistortion and estimate 310 performance corresponding to a next voltage (e.g., Vcc(i+1)) and so on until the minimum bias voltage 118 in the set of voltages and a corresponding predistortion are determined (if possible) that enable the power amplifier 110 to produce an amplified transmit signal 108 in accordance with a requirement. It should be noted that in a case where a next bias voltage (e.g., Vcc(i+1)) does not exist in the set of voltages (after decreasing 318 the current bias voltage), operation of the circuitry 102 may proceed to setting 314 at least one parameter.

If the next bias voltage (e.g., Vcc(i+1)) in the set of voltages and the corresponding next predistortion do not enable the power amplifier 110 to produce an amplified transmit signal 108 in accordance with a requirement, then the circuitry 102 (e.g., controller 122) may set 314 at least one parameter. For example, the controller 122 may send a parameter in the power supply control signal 120 that indicates the current bias voltage 118 (e.g., Vcc(i)). For instance, the current bias voltage (e.g., Vcc(i)) may be the minimum bias voltage that enables the power amplifier 110 to produce an amplified transmit signal 108 in accordance with a requirement, since it may have been the last such bias voltage before the next bias voltage (e.g., Vcc(i+1)) was determined 312 to not enable satisfaction of the requirement.

Additionally or alternatively, the controller 122 sends one or more parameters in the predistortion control signal 124 that indicate or define the predistortion (corresponding to the current bias voltage (e.g., Vcc(i)) to be applied by the predistorter 106 to the transmit signal 104. For instance, the predistortion control signal 124 may indicate an AMAM/AMPM look-up table (LUT) that defines the predistortion. In some configurations, the circuitry 102 (e.g., controller 122) may set one or more additional parameters, such as one or more baseband gains and/or one or more radio transceiver (RTR) gains.

The circuitry 102 may predistort and amplify the transmit signal 104 in accordance with the set 314 parameter(s). The circuitry 102 may also transmit the resulting amplified transmit signal 108.

The circuitry 102 may determine 316 whether reevaluation is needed based on one or more criteria. The one or more criteria may include, for example, a periodic trigger, whether an amount of time has elapsed (since the last capture 304 or last setting 314, for example) and whether temperature has changed (e.g., increased) (since the last capture 304 or last setting 314, for example). If the circuitry 102 determines 316 that reevaluation is needed, then the circuitry 102 may return to capture 304 a transmit signal 104 and a feedback signal 112.

The circuitry 102 may additionally or alternatively determine 316 whether a deficient performance occurs. A deficient performance may occur when one or more requirements are not being satisfied. For example, the circuitry 102 determines 316 whether one or more requirements are not being satisfied. Examples of the one or more requirements include requirements for adjacent channel leakage ratio (ACLR), adjacent channel power ratio (ACPR), peak-to-average ratio (PAR), error vector magnitude (EVM), output power (e.g., Pout), receive band noise (RxBN) and/or gain.

If a deficient performance occurs, the circuitry 102 may return (e.g., fall back) to setting 302 the current bias voltage to the initial voltage (e.g., Vcc(0) or any other bias voltage that is deemed "safe"). For instance, the index i may be reset to 0. For example, the circuitry 102 may set 302 the current bias voltage to an initial voltage based on average power tracking (APT). Additionally or alternatively, the initial bias voltage may be any other bias voltage that the algorithm has determined while decreasing the voltage (from Vcc(i) to Vcc(i+1), for example). At any of those steps, one or more calculations may deem a bias voltage "safe" in terms of having enough margin in the predicted performance requirement(s) (e.g., ACLR, RxBN, gain, etc.). Accordingly, the bias voltage (e.g., Vcc) utilized during that step may become the next "safe" fallback point. However, if reevaluation is not needed and/or if a deficient performance does not occur, then the circuitry 102 may continue to operate according to the current settings based on the current bias voltage 118 (e.g., Vcc(i)) that is a minimum voltage from the set of voltages that enables the power amplifier 110 to produce an amplified transmit signal 108 in accordance with a requirement.

Figure 4:
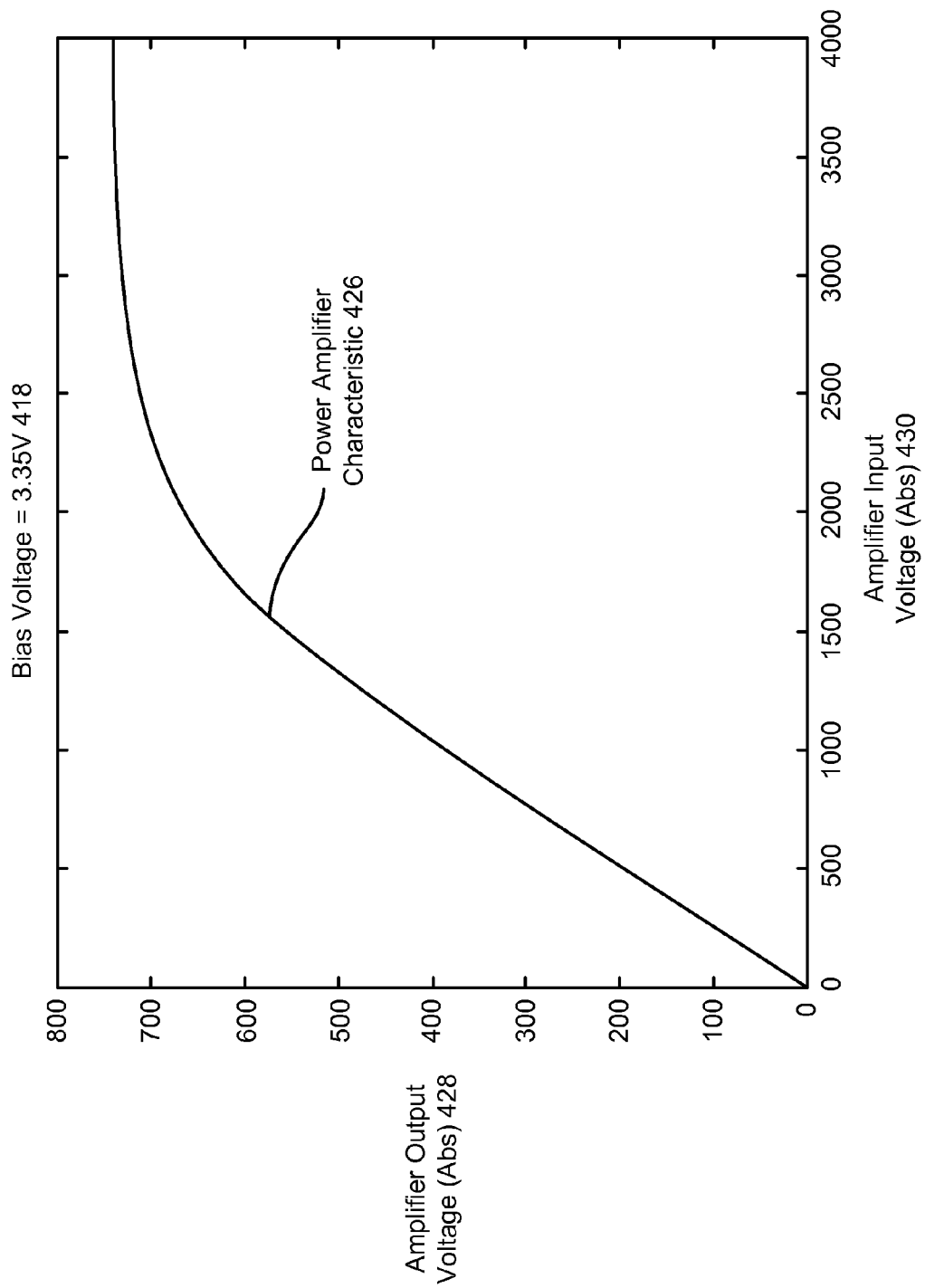
FIG. 4 is a graph illustrating one example of a power amplifier characteristic.

FIG. 4 is a graph illustrating one example of a power amplifier characteristic 426. In particular, FIG. 4 illustrates one example of a power amplifier characteristic 426 corresponding to a current bias voltage 418 of 3.35 volts (V). The power amplifier characteristic 426 is illustrated over the absolute value of an amplifier input voltage 430 versus amplifier output voltage 428. In FIG. 4, the horizontal (e.g., x) axis is marked in least significant bits (LSBs) of the amplitude of the transmit signal (e.g., the transmit signal 104b that will be upconverted and become the input to the power amplifier 110). Furthermore, the vertical (e.g., y) axis is in least significant bits (LSBs) of the amplitude of the feedback receiver (e.g., the controller 122), which may have an arbitrary gain scaling, depending on the implementation of the downconversion feedback path and the analog-to-digital converter (ADC) used to digitize the feedback signal (e.g., feedback signal 112).

For example, the circuitry 102 (e.g., controller 122) determines the power amplifier characteristic 426 based on the captured transmit signal 104 and feedback signal 112 that correspond to the current bias voltage 418 of 3.35 V. The power amplifier characteristic 426 may indicate the response (e.g., output voltage (e.g., Vout) 428 versus input voltage (e.g., Vin) 430) of the power amplifier 110 at the current bias voltage 418. The response may illustrate the linearity of the power amplifier 110 (e.g., the range of voltages over which the power amplifier characteristic 426 is approximately linear).

In some configurations, the circuitry 102 (e.g., controller 122) determines the power amplifier characteristic as follows. The controller 122 extracts matching signals from the captured transmit signal 104 and feedback signal 112. For example, the controller 122 performs one or more of frequency error correction, coarse matching, fine matching and equalization in order to extract matching signals. The controller 122 also performs phase correction and optionally performs binning. The controller 122 further performs curve fitting to determine the power amplifier characteristic 426 (e.g., an AMAM/AMPM characteristic of the power amplifier 110).

Figure 5:
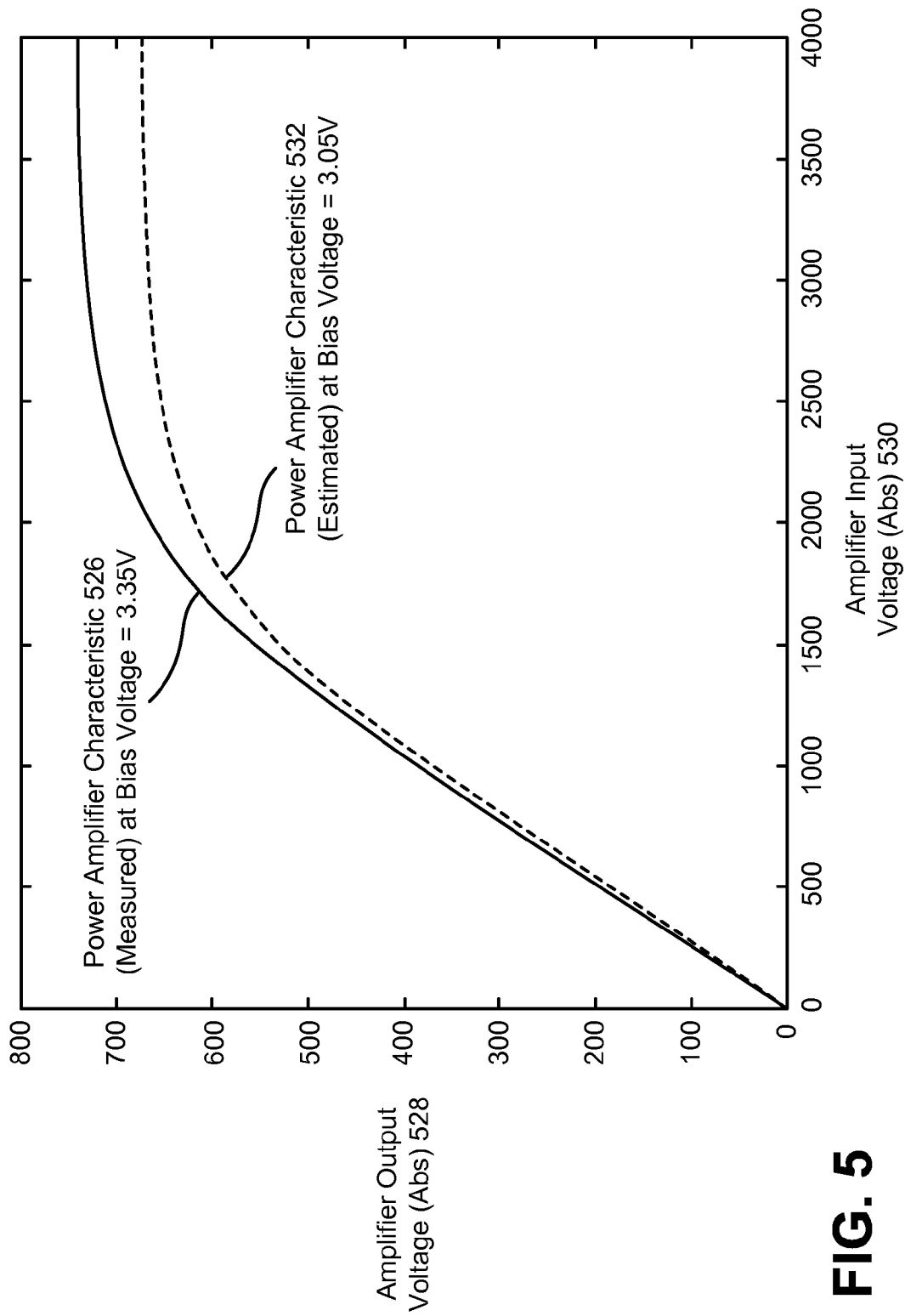
FIG. 5 is a graph illustrating one example of an estimated power amplifier characteristic.

FIG. 5 is a graph illustrating one example of an estimated power amplifier characteristic 532. In particular, FIG. 5 illustrates one example of a (measured) power amplifier characteristic 526 corresponding to a current bias voltage of 3.35 V and one example of an (estimated) power amplifier characteristic 532 corresponding to a next bias voltage of 3.05 V. The (estimated) power amplifier characteristic 532 is illustrated over the absolute value of an amplifier input voltage 530 versus amplifier output voltage 528. In FIG. 5, the axes may have units as similarly detailed in connection with FIG. 4 above.

The circuitry 102 (e.g., controller 122) may determine predistortion corresponding to a next bias voltage (e.g., Vcc (i+1)=3.05 V) in a set of voltages. The next bias voltage (e.g., Vcc(i+1)) may be a lower voltage compared to the current voltage (e.g., Vcc(i)=3.35 V) in the set of voltages. The predistortion is determined based on data feedback and/or a pre-stored calibration.

In particular, FIG. 5 illustrates one part of an example of determining (e.g., predicting) the predistortion in one shot. The controller 122 scales the determined (e.g., measured) power amplifier characteristic 526 (e.g., an AMAM curve corresponding to the current voltage Vcc(i)=3.35 V) based on a saturation voltage (e.g., Vosat) and gains at various bias voltages (e.g., Vcc) in order to determine (e.g., predict) an next power amplifier characteristic 532 corresponding to the next bias voltage (e.g., Vcc(i+1)=3.05V).

Figure 6:
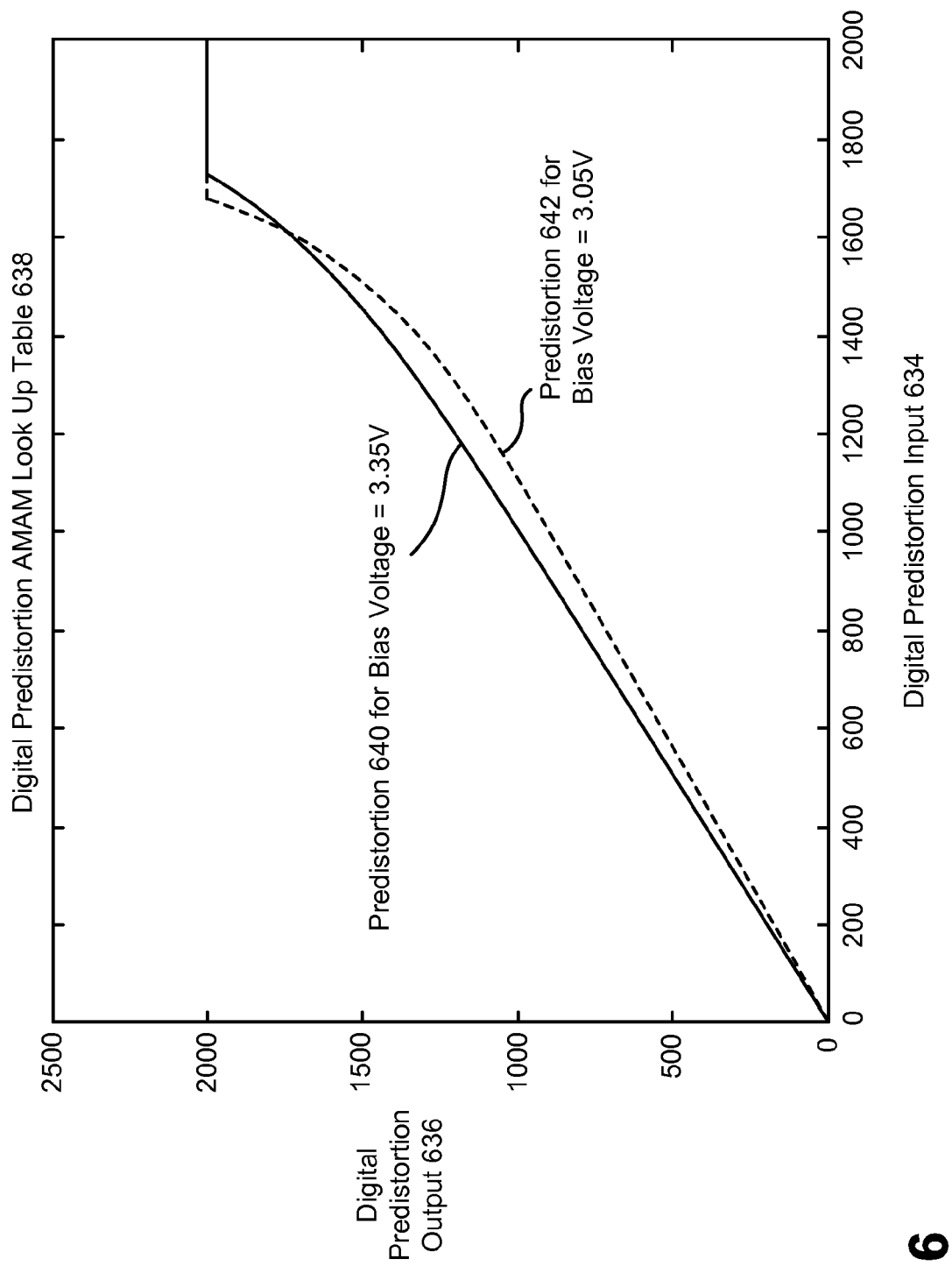
FIG. 6 is a graph illustrating examples of a digital predistortion look up table.

FIG. 6 is a graph illustrating examples of a digital predistortion look up table 638. In particular, examples of predistortion 640, 642 are illustrated over a digital predistortion input 634 versus a digital predistortion output 636. The horizontal and vertical axes may be represented in least significant bits (LSBs) of the amplitude on a digital transmission signal (e.g., transmission signal 104) being predistorted. The predistortions 640, 642 illustrated may be implemented in a digital predistortion AMAM look up table (LUT) 638. It should be noted that predistortion may be implemented in an AMPM LUT in addition to the AMAM LUT and/or an AMAM LUT may be integrated into the same table as an AMPM LUT in some configurations.

In FIG. 6, a first predistortion 640 corresponding to a current bias voltage (e.g., Vcc(i)=3.35 V) is illustrated. A second predistortion 642 corresponding to a next bias voltage (e.g., Vcc(i+1)=3.05 V) is also illustrated. The second predistortion 642 may be determined by the circuitry 102 (e.g., controller 122) based on the (estimated) next power amplifier characteristic 532 corresponding to the next bias voltage (e.g., Vcc(i+1)=3.05 V) illustrated in FIG. 5. In other words, FIG. 6 illustrates a subsequent part of the example described in FIG. 5, where the controller 122 inverts the power amplifier characteristic 532 corresponding to the next voltage (e.g., Vcc(i+1)=3.05 V) in order to determine the second predistortion 642. In this example, the controller 122 may send parameters in the predistortion control signal 124 to the predistorter 106 in order to set the digital predistortion AMAM LUT 638, in the case that the second predistortion 642 corresponds to the minimum bias voltage in a set of voltages that enables the power amplifier 110 to produce an amplified transmit signal 108 in accordance with a requirement.

Figure 7:
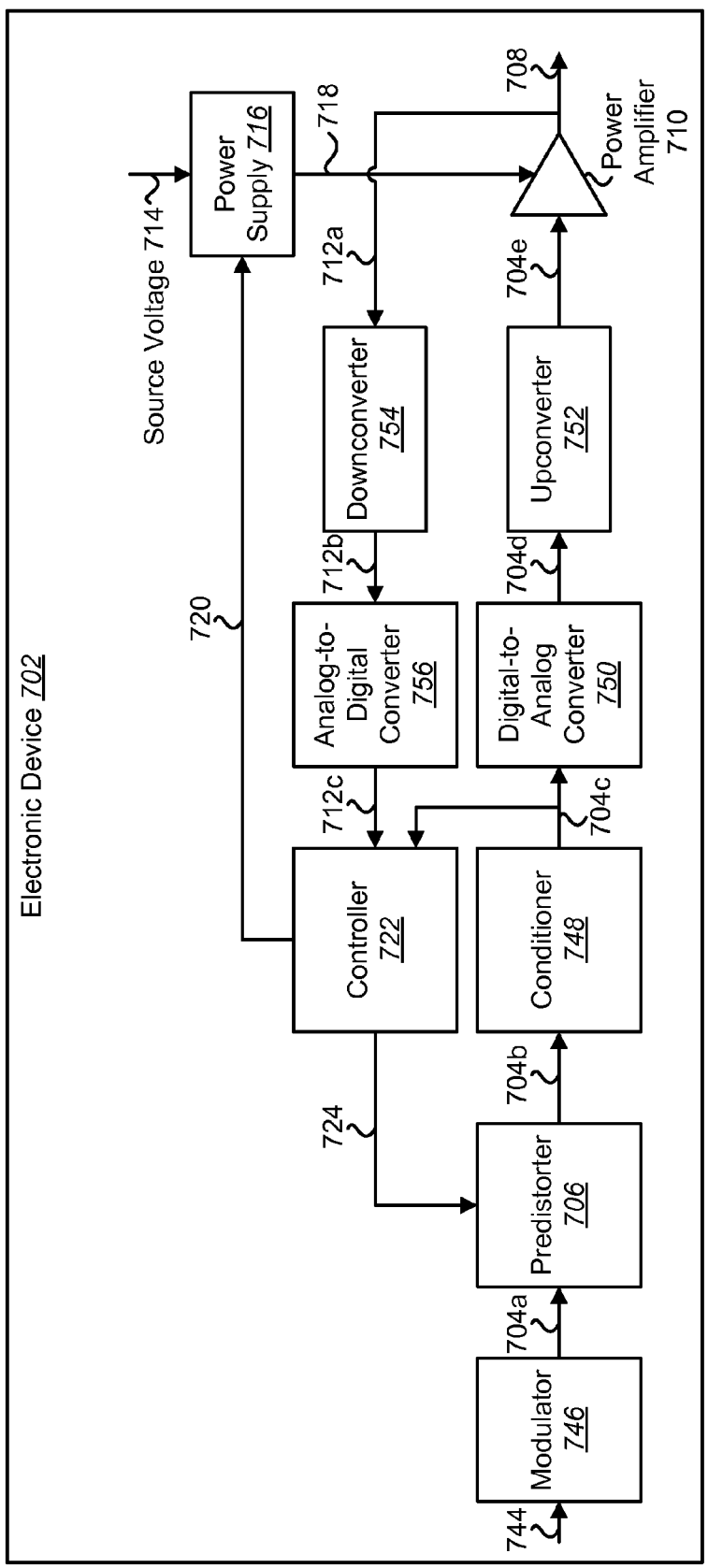
FIG. 7 is a block diagram illustrating one configuration of an electronic device for reducing power consumption.

FIG. 7 is a block diagram illustrating one configuration of an electronic device 702 for reducing power consumption. The electronic device 702 may be one example of the circuitry 102 described in connection with FIG. 1. The electronic device 702 includes a power amplifier 710, a predistorter 706, a controller 722, a power supply 716, a modulator 746, a conditioner 748, a digital-to-analog converter 750 (DAC), an upconverter 752, a downconverter 754 and an analog-to-digital converter 756 (ADC). One or more of the elements or components included in the electronic device 702 may be implemented in hardware, software or a combination of both. For example, one or more of the elements or components included in the electronic device 702 may be implemented in circuitry, circuit components (e.g., resistors, transistors, capacitors, inductors, etc.), memory blocks, registers, processing blocks and/or in instructions (e.g., software code) stored in memory that are executed on a processor.

The power amplifier 710 may amplify a transmit signal 704. In some configurations, the power amplifier 710 may increase the amplitude of the transmit signal 704 for wireless transmission. The power amplifier 710 is coupled to the power supply 716. The performance of the power amplifier 710 may vary based on a bias voltage 718 that is provided by the power supply 716. For example, the magnitude of the amplification provided by the power amplifier 710 and/or the linearity of the power amplifier 710 may vary based on the bias voltage 718 provided.

The power supply 716 produces the bias voltage 718 based on a source voltage 714 and a power supply control signal 720 provided by the controller 722. One example of the power supply 716 is a switched mode power supply (SMPS). For instance, the power supply 716 may be a direct current-to-direct current (DC-to-DC) converter. The power supply 716 may reduce the source voltage 714 to a lower bias voltage 718. The source voltage 714 may be provided by a battery, a power adapter and/or some other source, for example.

The modulator 746 is coupled to the predistorter 706, which is coupled to the controller 722 and to the conditioner 748. Transmit information 744 is provided to the modulator 746. The modulator 746 modulates the transmit information 744 according to a modulation scheme (e.g., phase-shift keying (PSK), quadrature amplitude modulation (QAM), etc.) to produce a modulated transmit signal 704a that is provided to the predistorter 706. The predistorter 706 may apply predistortion to the modulated transmit signal 704a. However, the predistorter 706 may not always apply predistortion to the modulated transmit signal 704a (e.g., when predistortion is not required to linearize the amplified transmit signal 708). The resulting (predistorted) transmit signal 704b is provided to the conditioner 748. The conditioner 748 may perform one or more operations on the (predistorted) transmit signal 704b in order to produce a conditioned transmit signal 704c. For example, the conditioner 748 may perform upsampling, filtering, etc., on the (predistorted) transmit signal 704b.

The conditioner 748 is coupled to the controller 722 and to the digital-to-analog converter 750. The conditioned transmit signal 704c is provided to the controller 722 and to the digital-to-analog converter 750. The digital-to-analog converter 750 converts to the conditioned transmit signal 704c to an analog transmit signal 704d. The digital-to-analog converter 750 is coupled to the upconverter 752. The analog transmit signal 704d is provided to the upconverter 752, which upconverts the analog transmit signal 704d (into the radio frequency (RF) range, for example) to produce an upconverted transmit signal 704e, which is provided to the power amplifier 710.

The power amplifier 710 may be coupled to a switch/duplexer (not shown in FIG. 7), which in turn may be coupled to an antenna (not shown in FIG. 7). The power amplifier 710 is coupled to the downconverter 754. The power amplifier 710 may produce an amplified transmit signal 708. A feedback signal 712a may be provided to the downconverter 754 from the amplified transmit signal 708. It should be noted that the feedback signal 712a may be captured by the controller 722 before or after the switch or duplexer.

The downconverter 754 downconverts the feedback signal 712a (into a baseband frequency range, for example) to produce a downconverted feedback signal 712b. In some configurations, the downconverter 754 may be capable of converting a smaller dynamic range than the upconverter 752. For example, the downconverter 754 may convert the feedback signal 712a, which may be in a power range of 20-30 dB of power, compared to the upconverter 752, which may convert the analog transmit signal 704d, which may be in a power range of 70-80 dB of power. In some configurations, the upconverter 752 and downconverter 754 may be implemented in the same circuit (e.g., radio transceiver (RTR)), while in other configurations, the upconverter 752 and downconverter 754 may be implemented in separate circuits (e.g., radio transceivers (RTRs)). The downconverter 754 is coupled to the analog-to-digital converter 756. The downconverted feedback signal 712b is provided to the analog-to-digital converter 756.

The analog-to-digital converter 756 converts the downconverted feedback signal 712b to a digital feedback signal 712c. The analog-to-digital converter 756 is coupled to the controller 722. The digital feedback signal 712c is provided to the controller 722.

In some configurations, the feedback signal 712 (e.g., feedback signal 712a, downconverted feedback signal 712b and digital feedback signal 712c) may comprise four signals. For example, the feedback signal 712 may comprise differential in-phase components (e.g., I+ and I−) and differential quadrature components (e.g., Q+ and Q−). In these configurations, the downconverter 754, analog-to-digital converter 756 and the controller 722 may be implemented to utilize these four signals.

The controller 722 is coupled to the analog-to-digital converter 756, to the power supply 716, to the predistorter 706, to the conditioner 748 and to the digital-to-analog converter 750. The controller 722 controls the power supply 716 and the predistorter 706 based on the conditioned transmit signal 704c and the digital feedback signal 712c. In particular, the controller 722 determines a minimum bias voltage 718 from a set of voltages and a predistortion that enable the power amplifier 710 to produce an amplified transmit signal 708 in accordance with a requirement. For example, the controller 722 may determine this minimum bias voltage 718 and predistortion that enable the power amplifier 710 to produce an amplified transmit signal 708 in accordance with one or more of the methods 200, 300 described in connection with FIGS. 2-3 above.

The controller 722 provides the power supply control signal 720 to the power supply 716. The power supply control signal 720 may cause the power supply 716 to produce a particular bias voltage 718. For example, the power supply control signal 720 may include one or more parameters that correspond to or indicate a particular bias voltage 718.

The controller 722 may cause the power supply 716 to produce a bias voltage 718 from a set of voltages. The set of voltages may include one or more voltages. For example, the set of voltages may comprise a finite set of discrete voltages that the controller 722 may cause the power supply 716 to produce. In some cases, the set of voltages may be limited by a resolution of the controller 722, the power supply 716 or both. For example, the power supply control signal 720 may be represented with a finite number of bits, indicators or parameters. Accordingly, the controller 722 may indicate bias voltages 718 based on a finite number of steps or a finite number of values. Thus, the minimum bias voltage 718 from the set of voltages that enables the power amplifier 710 to produce an amplified transmit signal 708 in accordance with one or more requirements may be the lowest possible voltage in the set of voltages where the requirement(s) are still met. Accordingly, a next lower voltage in relation to this minimum bias voltage 718 in the set of voltages (if one exists) would not enable the power amplifier 710 to produce an amplified transmit signal 708 in accordance with the requirement(s).

The controller 722 also provides a predistortion control signal 724 to the predistorter 706. The predistortion control signal 724 may cause the predistorter 706 to apply a particular predistortion to the transmit signal 704a. For example, the predistortion control signal 724 may include one or more parameters that indicate a particular predistortion. In some configurations, the predistortion control signal 724 may indicate an AMAM/AMPM look-up table (LUT) that defines the predistortion. Additionally or alternatively, the predistortion control signal 724 may include one or more parameters that functionally define the predistortion (e.g., based on one or more of a polynomial function, volterra model, piecewise function, etc.). It should be noted that the predistorter 706 may be implemented to provide digital predistortion or analog predistortion. For instance, the predistorter 706 may be implemented with a digital signal processor (DSP) in some configurations.

The predistorter 706 is coupled to the controller 722, to the modulator 746 and to the conditioner 748. The predistorter 706 may apply predistortion to the modulated transmit signal 704a. For example, the predistorter 706 applies predistortion specified by the predistortion control signal 724. Applying predistortion to the modulated transmit signal 704a may enable the power amplifier 710 to operate with a lower bias voltage 718 while still producing an amplified transmit signal 708 that meets one or more requirements. Examples of the one or more requirements include one or more specified values for adjacent channel leakage ratio (ACLR), adjacent channel power ratio (ACPR), peak-to-average ratio (PAR), error vector magnitude (EVM), output power (e.g., Pout), receive band noise (RxBN) and/or gain.

Figure 8:
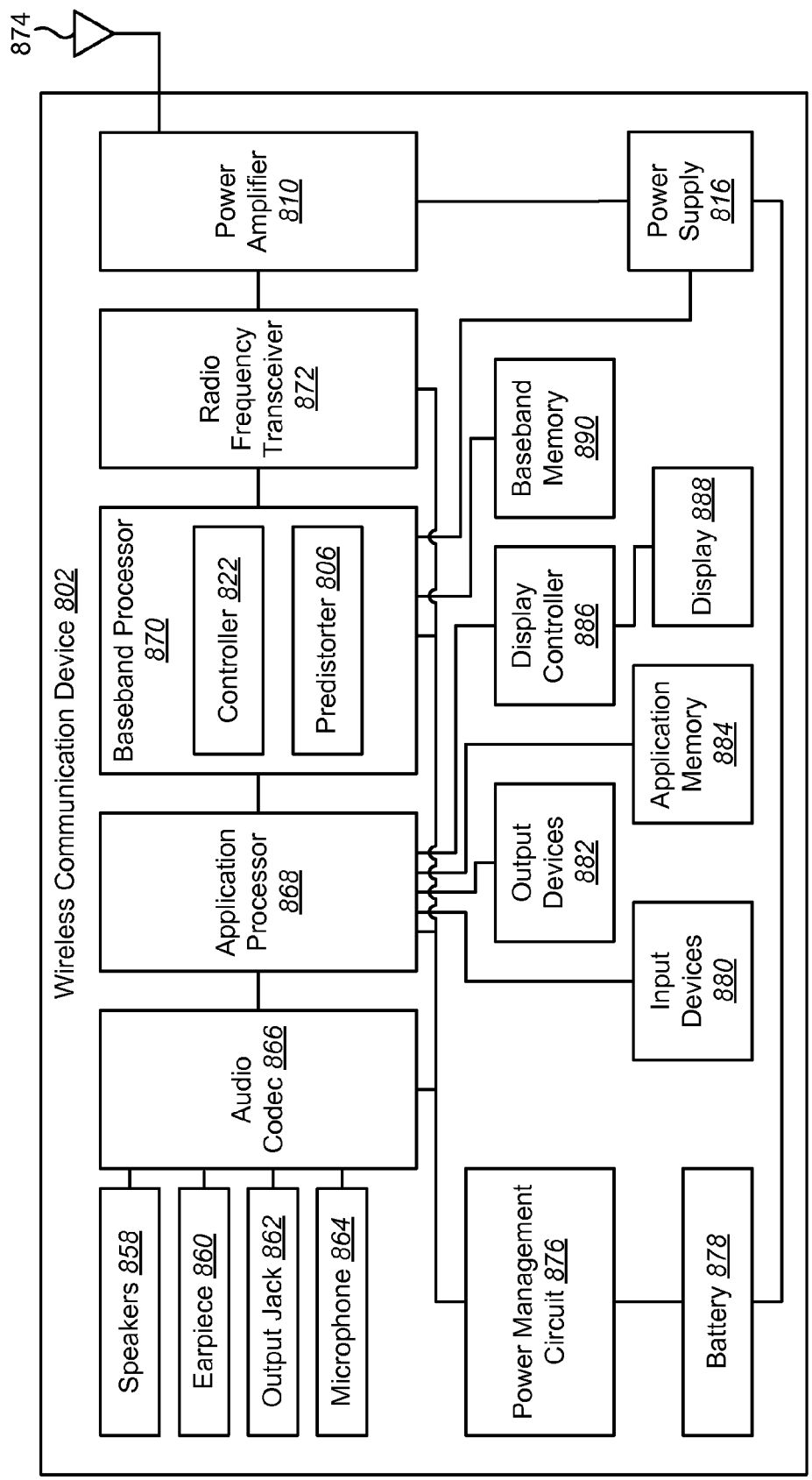
FIG. 8 is a block diagram illustrating one configuration of a wireless communication device in which systems and method for reducing power consumption may be implemented.

FIG. 8 is a block diagram illustrating one configuration of a wireless communication device 802 in which systems and method for reducing power consumption may be implemented. The wireless communication device 802 may include an application processor 868. The application processor 868 generally processes instructions (e.g., runs programs) to perform functions on the wireless communication device 802. The application processor 868 may be coupled to an audio coder/decoder (codec) 866.

The audio codec 866 may be circuitry used for coding and/or decoding audio signals. The audio codec 866 may be coupled to one or more speakers 858, an earpiece 860, an output jack 862 and/or one or more microphones 864. The speakers 858 may include one or more electro-acoustic transducers that convert electrical or electronic signals into acoustic signals. For example, the speakers 858 may be used to play music or output a speakerphone conversation, etc. The earpiece 860 may be another speaker or electro-acoustic transducer that can be used to output acoustic signals (e.g., speech signals) to a user. For example, the earpiece 860 may be designed such that only a user may reliably hear an acoustic signal output from the earpiece 860. The output jack 862 may be used for coupling other devices to the wireless communication device 802 for outputting audio, such as headphones. The speakers 858, earpiece 860 and/or output jack 862 may generally be used for outputting an audio signal from the audio codec 866. The one or more microphones 864 may be acousto-electric transducer that converts an acoustic signal (such as a user's voice) into electrical or electronic signals that are provided to the audio codec 866.

The application processor 868 may also be coupled to a power management circuit 876. One example of a power management circuit 876 is a power management integrated circuit (PMIC), which may be used to manage the electrical power consumption of the wireless communication device 802. The power management circuit 876 may be coupled to a battery 878. The battery 878 may generally provide electrical power to the wireless communication device 802. It should be noted that one or more of the components included within the wireless communication device 802 that require electrical power to function may be coupled (e.g., directly and/or indirectly) to the battery 878 and/or power management circuit 876.

The application processor 868 may be coupled to one or more input devices 880 for receiving input. Examples of input devices 880 include infrared sensors, image sensors, accelerometers, touch sensors, keypads, etc. The input devices 880 may allow user interaction with the wireless communication device 802. The application processor 868 may also be coupled to one or more output devices 882. Examples of output devices 882 include printers, projectors, screens, haptic devices, etc. The output devices 882 may allow the wireless communication device 802 to produce output that may be experienced by a user.

The application processor 868 may be coupled to application memory 884. The application memory 884 may be any electronic device that is capable of storing electronic information. Examples of application memory 884 include double data rate synchronous dynamic random access memory (DDRAM), synchronous dynamic random access memory (SDRAM), flash memory, etc. The application memory 884 may provide storage for the application processor 868. For instance, the application memory 884 may store data and/or instructions for the functioning of programs that are run on the application processor 868.

The application processor 868 may be coupled to a display controller 886, which in turn may be coupled to a display 888. The display controller 886 may be a hardware block that is used to generate images on the display 888. For example, the display controller 886 may translate instructions and/or data from the application processor 868 into images that can be presented on the display 888. Examples of the display 888 include liquid crystal display (LCD) panels, light emitting diode (LED) panels, cathode ray tube (CRT) displays, plasma displays, etc.

The application processor 868 may be coupled to a baseband processor 870. The baseband processor 870 generally processes communication signals. For example, the baseband processor 870 may demodulate and/or decode received signals. Additionally or alternatively, the baseband processor 870 may encode and/or modulate signals in preparation for transmission.

The baseband processor 870 may include a controller 822 and predistorter 806. The controller 822 may be similar to one or more of the controllers 122, 722 described above. Additionally or alternatively, the predistorter 806 may be similar to one or more of the predistorters 106, 706 described above.

The baseband processor 870 may be coupled to baseband memory 890. The baseband memory 890 may be any electronic device capable of storing electronic information, such as SDRAM, DDRAM, flash memory, etc. The baseband processor 870 may read information (e.g., instructions and/or data) from and/or write information to the baseband memory 890. Additionally or alternatively, the baseband processor 870 may use instructions and/or data stored in the baseband memory 890 to perform communication operations.

The baseband processor 870 may be coupled to a radio frequency (RF) transceiver 872. The RF transceiver 872 may be coupled to a power amplifier 810 and one or more antennas 874. The RF transceiver 872 may transmit and/or receive radio frequency signals. For example, the RF transceiver 872 may transmit an RF signal using a power amplifier 810 and one or more antennas 874. The RF transceiver 872 may also receive RF signals using the one or more antennas 874. Examples of the wireless communication device 802 include cellular phones, smart phones, laptop computers, personal digital assistants (PDAs), audio players, wireless modems, gaming systems, etc.

In some configurations, the radio frequency transceiver 872 may include one or more upconverters and/or downconverters. For example, the radio frequency transceiver 872 may include an upconverter similar to the upconverter 752 described in connection with FIG. 7. Additionally or alternatively, the radio frequency transceiver 872 may include a downconverter similar to the downconverter 754 described in connection with FIG. 7.

In some configurations, the power amplifier 810 may be similar to one or more of the power amplifiers 110, 710 described above. The power amplifier 810 may be coupled to a power supply 816, which in turn may be coupled to the battery 878 and to the baseband processor 870. In some configurations, the power supply 816 may be similar to one or more of the power supplies 116, 716 described above.

Figure 9:
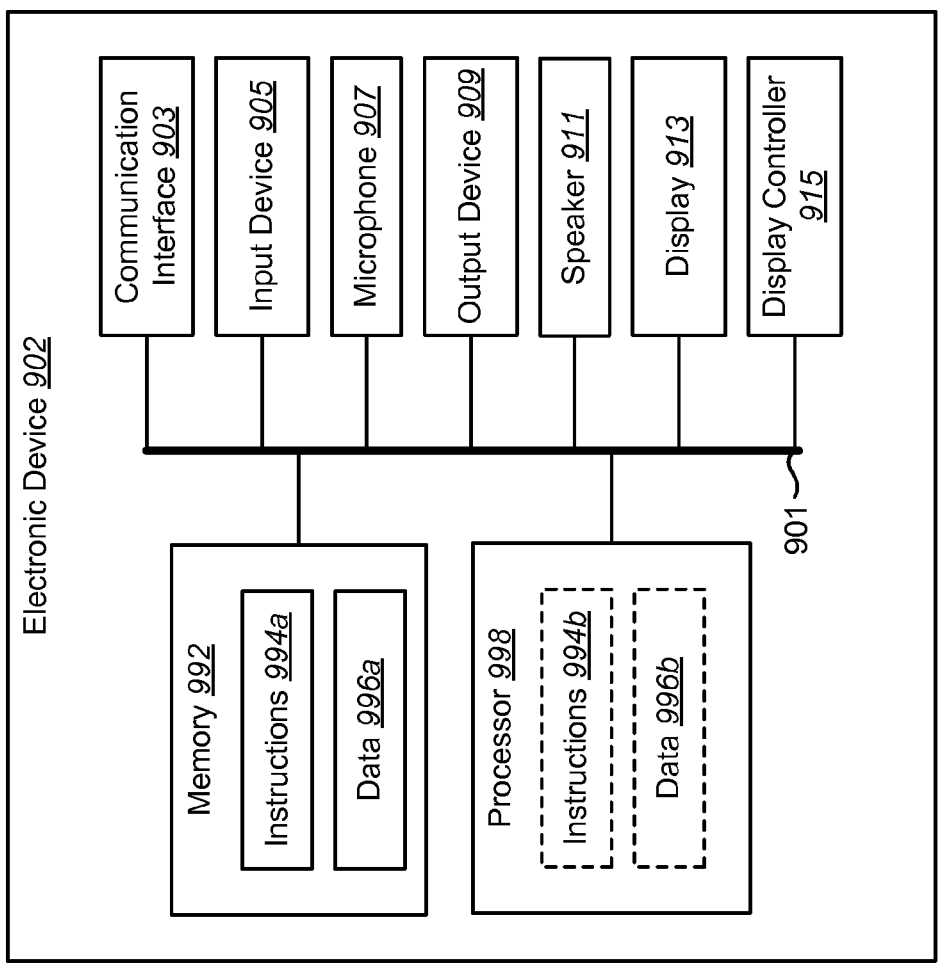
FIG. 9 illustrates various components that may be utilized in an electronic device.

FIG. 9 illustrates various components that may be utilized in an electronic device 902. The illustrated components may be located within the same physical structure or in separate housings or structures. One or more of the circuitry 102 and the electronic device 702 described herein may be implemented in accordance with the electronic device 902 described in FIG. 9. The electronic device 902 includes a processor 998. The processor 998 may be a general purpose single- or multi-chip microprocessor (e.g., an ARM), a special purpose microprocessor (e.g., a digital signal processor (DSP)), a microcontroller, a programmable gate array, etc. The processor 998 may be referred to as a central processing unit (CPU). Although just a single processor 998 is shown in the electronic device 902 of FIG. 9, in an alternative configuration, a combination of processors (e.g., an ARM and DSP) could be used.

The electronic device 902 also includes memory 992 in electronic communication with the processor 998. That is, the processor 998 can read information from and/or write information to the memory 992. The memory 992 may be any electronic component capable of storing electronic information. The memory 992 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 996a and instructions 994a may be stored in the memory 992. The instructions 994a may include one or more programs, routines, sub-routines, functions, procedures, etc. The instructions 994a may include a single computer-readable statement or many computer-readable statements. The instructions 994a may be executable by the processor 998 to implement one or more of the methods 200, 300 described above. Executing the instructions 994a may involve the use of the data 996a that is stored in the memory 992. FIG. 9 shows some instructions 994b and data 996b being loaded into the processor 998 (which may come from instructions 994a and data 996a).

The electronic device 902 may also include one or more communication interfaces 903 for communicating with other electronic devices. The communication interfaces 903 may be based on wired communication technology, wireless communication technology, or both. Examples of different types of communication interfaces 903 include a serial port, a parallel port, a Universal Serial Bus (USB), an Ethernet adapter, an IEEE 1394 bus interface, a small computer system interface (SCSI) bus interface, an infrared (IR) communication port, a Bluetooth wireless communication adapter, and so forth.

The electronic device 902 may also include one or more input devices 905 and one or more output devices 909. Examples of different kinds of input devices 905 include a keyboard, mouse, microphone, remote control device, button, joystick, trackball, touchpad, lightpen, etc. For instance, the electronic device 902 may include one or more microphones 907 for capturing acoustic signals. In one configuration, a microphone 907 may be a transducer that converts acoustic signals (e.g., voice, speech) into electrical or electronic signals. Examples of different kinds of output devices 909 include a speaker, printer, etc. For instance, the electronic device 902 may include one or more speakers 911. In one configuration, a speaker 911 may be a transducer that converts electrical or electronic signals into acoustic signals. One specific type of output device which may be typically included in an electronic device 902 is a display device 913. Display devices 913 used with configurations disclosed herein may utilize any suitable image projection technology, such as a cathode ray tube (CRT), liquid crystal display (LCD), light-emitting diode (LED), gas plasma, electroluminescence, or the like. A display controller 915 may also be provided, for converting data stored in the memory 992 into text, graphics, and/or moving images (as appropriate) shown on the display device 913.

The various components of the electronic device 902 may be coupled together by one or more buses, which may include a power bus, a control signal bus, a status signal bus, a data bus, etc. For simplicity, the various buses are illustrated in FIG. 9 as a bus system 901. It should be noted that FIG. 9 illustrates only one possible configuration of an electronic device 902. Various other architectures and components may be utilized.

Figure 10:
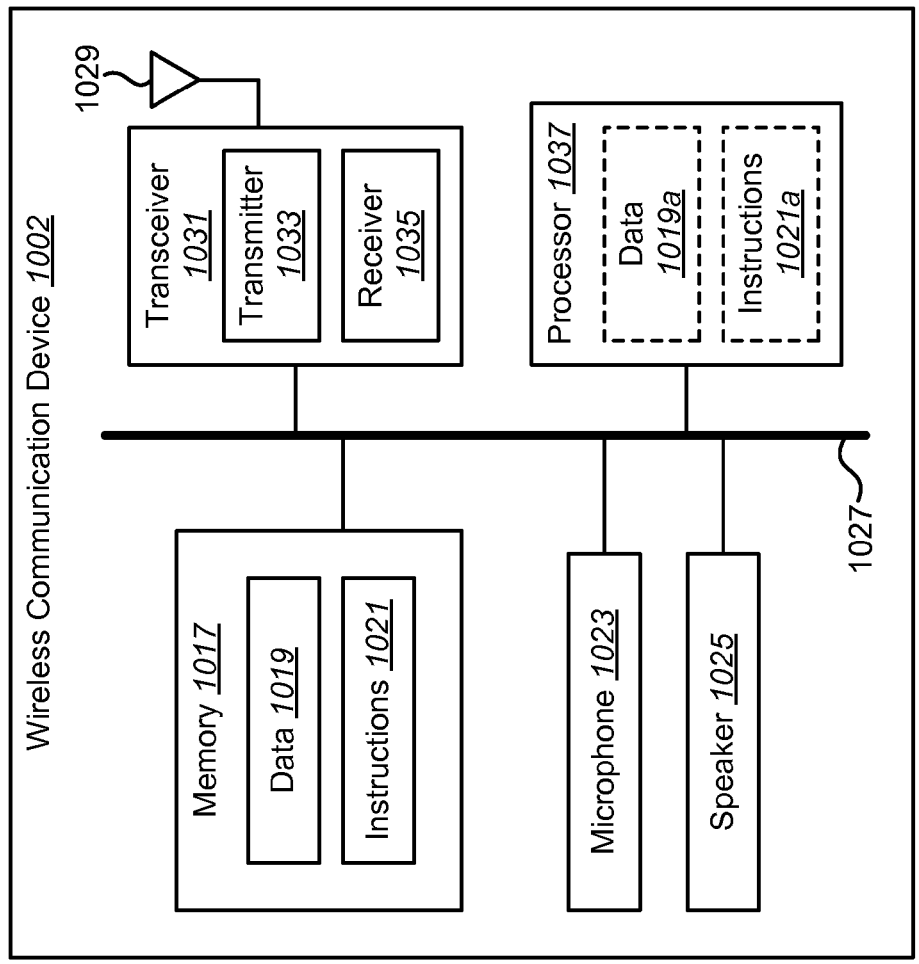
FIG. 10 illustrates certain components that may be included within a wireless communication device.

FIG. 10 illustrates certain components that may be included within a wireless communication device 1002. One or more of the circuitry 102 and the electronic device 702 described herein may be implemented in accordance with the wireless communication device 1002 described in FIG. 10.

The wireless communication device 1002 includes a processor 1037. The processor 1037 may be a general purpose single- or multi-chip microprocessor (e.g., an ARM), a special purpose microprocessor (e.g., a digital signal processor (DSP)), a microcontroller, a programmable gate array, etc. The processor 1037 may be referred to as a central processing unit (CPU). Although just a single processor 1037 is shown in the wireless communication device 1002 of FIG. 10, in an alternative configuration, a combination of processors (e.g., an ARM and DSP) could be used.

The wireless communication device 1002 also includes memory 1017 in electronic communication with the processor 1037 (i.e., the processor 1037 can read information from and/or write information to the memory 1017). The memory 1017 may be any electronic component capable of storing electronic information. The memory 1017 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 1019 and instructions 1021 may be stored in the memory 1017. The instructions 1021 may include one or more programs, routines, sub-routines, functions, procedures, code, etc. The instructions 1021 may include a single computer-readable statement or many computer-readable statements. The instructions 1021 may be executable by the processor 1037 to implement one or more of the methods 200, 300 described above. Executing the instructions 1021 may involve the use of the data 1019 that is stored in the memory 1017. FIG. 10 shows some instructions 1021a and data 1019a being loaded into the processor 1037 (which may come from instructions 1021 and data 1019).

The wireless communication device 1002 may also include a transmitter 1033 and a receiver 1035 to allow transmission and reception of signals between the wireless communication device 1002 and a remote location (e.g., another electronic device, wireless communication device, etc.). The transmitter 1033 and receiver 1035 may be collectively referred to as a transceiver 1031. An antenna 1029 may be electrically coupled to the transceiver 1031. The wireless communication device 1002 may also include (not shown) multiple transmitters, multiple receivers, multiple transceivers and/or multiple antenna.

In some configurations, the wireless communication device 1002 may include one or more microphones 1023 for capturing acoustic signals. In one configuration, a microphone 1023 may be a transducer that converts acoustic signals (e.g., voice, speech) into electrical or electronic signals. Additionally or alternatively, the wireless communication device 1002 may include one or more speakers 1025. In one configuration, a speaker 1025 may be a transducer that converts electrical or electronic signals into acoustic signals.

The various components of the wireless communication device 1002 may be coupled together by one or more buses, which may include a power bus, a control signal bus, a status signal bus, a data bus, etc. For simplicity, the various buses are illustrated in FIG. 10 as a bus system 1027.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. Circuitry for reducing power consumption, comprising:
a power amplifier;
a predistorter coupled to the power amplifier;
a power supply coupled to the power amplifier; and
a controller coupled to the power amplifier, to the predistorter and to the power supply, wherein the controller captures a transmit signal and a feedback signal concurrently, wherein the controller is configured to determine a minimum bias voltage for the power supply that enables the power amplifier to produce an amplified transmit signal in accordance with a requirement, wherein determining the minimum bias voltage comprises determining a next predistortion corresponding to a next bias voltage in a set of voltages, and wherein the controller is configured to decrease a current bias voltage if the next bias voltage and the next predistortion enable the power amplifier to produce the amplified transmit signal in accordance with the requirement.

2. The circuitry of claim 1, wherein determining the minimum bias voltage comprises:
determining a power amplifier characteristic corresponding to a current bias voltage, wherein the next bias voltage is lower than the current bias voltage; and
estimating performance corresponding to the next bias voltage.

3. The circuitry of claim 2, wherein the controller further iterates determining the next predistortion and estimating performance.

4. The circuitry of claim 2, wherein estimating performance corresponding to the next voltage comprises estimating one or more performance metrics corresponding to the next bias voltage, wherein the one or more performance metrics include at least one of the group consisting of adjacent channel leakage ratio (ACLR), adjacent channel power ratio (ACPR), peak-to-average ratio (PAR), error vector magnitude (EVM), receive band noise (RxBN), gain of an entire transmit chain and power of the entire transmit chain.

5. The circuitry of claim 2, wherein the controller further:
determines whether the next bias voltage and the next predistortion enable the power amplifier to produce the amplified transmit signal in accordance with the requirement; and
sets at least one parameter if the next bias voltage and the next predistortion do not enable the power amplifier to produce the amplified transmit signal in accordance with the requirement.

6. The circuitry of claim 5, wherein setting at least one parameter comprises:
sending a parameter in a power supply control signal that indicates the current bias voltage; and
sending one or more parameters in a predistortion control signal that indicate predistortion corresponding to the current bias voltage.

7. The circuitry of claim 2, wherein the controller further:
determines whether reevaluation is needed based on one or more criteria; and
determines whether a deficient performance occurs.

8. The circuitry of claim 7, wherein the controller further sets the current bias voltage to an initial voltage based on average power tracking (APT) if a deficient performance occurs.

9. The circuitry of claim 2, wherein determining the next predistortion comprises:
scaling the power amplifier characteristic to determine a next power amplifier characteristic corresponding to the next bias voltage; and
inverting the next power amplifier characteristic.

10. The circuitry of claim 1, wherein the requirement comprises a specified value for at least one of the group consisting of adjacent channel leakage ratio (ACLR), adjacent channel power ratio (ACPR), peak-to-average ratio (PAR), error vector magnitude (EVM), receive band noise (RxBN), gain of an entire transmit chain and power of the entire transmit chain.

11. The circuitry of claim 1, wherein the controller captures the feedback signal from an output of the power amplifier before a switch or duplexer.

12. The circuitry of claim 1, wherein the controller captures the feedback signal from an output of the power amplifier after a switch or duplexer.

13. A method for reducing power consumption by circuitry, comprising:
capturing a transmit signal and a feedback signal concurrently;
determining a minimum bias voltage for a power supply that enables a power amplifier to produce an amplified transmit signal in accordance with a requirement; wherein
determining the minimum bias voltage comprises determining a next predistortion corresponding to a next bias voltage in a set of voltages; and
decreasing a current bias voltage if the next bias voltage and the next predistortion enable the power amplifier to produce the amplified transmit signal in accordance with the requirement.

14. The method of claim 13, wherein determining the minimum bias voltage comprises:
determining a power amplifier characteristic corresponding to a current bias voltage, wherein the next bias voltage is lower than the current bias voltage; and
estimating performance corresponding to the next bias voltage.

15. The method of claim 14, further comprising iterating determining the next predistortion and estimating performance.

16. The method of claim 14, wherein estimating performance corresponding to the next voltage comprises estimating one or more performance metrics corresponding to the next bias voltage, wherein the one or more performance metrics include at least one of the group consisting of adjacent channel leakage ratio (ACLR), adjacent channel power ratio (ACPR), peak-to-average ratio (PAR), error vector magnitude (EVM), receive band noise (RxBN), gain of an entire transmit chain and power of the entire transmit chain.

17. The method of claim 14, further comprising:
determining whether the next bias voltage and the next predistortion enable the power amplifier to produce the amplified transmit signal in accordance with the requirement; and
setting at least one parameter if the next bias voltage and the next predistortion do not enable the power amplifier to produce the amplified transmit signal in accordance with the requirement.

18. The method of claim 17, wherein setting at least one parameter comprises:
sending a parameter in a power supply control signal that indicates the current bias voltage; and
sending one or more parameters in a predistortion control signal that indicate predistortion corresponding to the current bias voltage.

19. The method of claim 14, further comprising:
determining whether reevaluation is needed based on one or more criteria; and
determining whether a deficient performance occurs.

20. The method of claim 19, further comprising setting the current bias voltage to an initial voltage based on average power tracking (APT) if a deficient performance occurs.

21. The method of claim 14, wherein determining the next predistortion comprises:
scaling the power amplifier characteristic to determine a next power amplifier characteristic corresponding to the next bias voltage; and
inverting the next power amplifier characteristic.

22. The method of claim 13, wherein the requirement comprises a specified value for at least one of the group consisting of adjacent channel leakage ratio (ACLR), adjacent channel power ratio (ACPR), peak-to-average ratio (PAR), error vector magnitude (EVM), receive band noise (RxBN), gain of an entire transmit chain and power of the entire transmit chain.

23. The method of claim 13, wherein the feedback signal is captured from an output of the power amplifier before a switch or duplexer.

24. The method of claim 13, wherein the feedback signal is captured from an output of the power amplifier after a switch or duplexer.

25. A computer-program product for reducing power consumption, comprising a non-transitory tangible computer-readable medium having instructions thereon, the instructions comprising:
code for causing circuitry to capture a transmit signal and a feedback signal concurrently;
code for causing the circuitry to determine a minimum bias voltage for a power supply that enables a power amplifier to produce an amplified transmit signal in accordance with a requirement, wherein determining the minimum bias voltage comprises determining a next predistortion corresponding to a next bias voltage in a set of voltages; and
code for causing the circuitry to decrease a current bias voltage if the next bias voltage and the next predistortion enable the power amplifier to produce the amplified transmit signal in accordance with the requirement.

26. The computer-program product of claim 25, wherein the code for causing the circuitry to determine the minimum bias voltage comprises:
- code for causing the circuitry to determine a power amplifier characteristic corresponding to a current bias voltage, wherein the next bias voltage is lower than the current bias voltage; and
- code for causing the circuitry to estimate performance corresponding to the next bias voltage.

27. The computer-program product of claim 26, the instructions further comprising:
- code for causing the circuitry to determine whether the next bias voltage and the next predistortion enable the power amplifier to produce the amplified transmit signal in accordance with the requirement; and
- code for causing the circuitry to set at least one parameter if the next bias voltage and the next predistortion do not enable the power amplifier to produce the amplified transmit signal in accordance with the requirement.

28. The computer-program product of claim 26, the instructions further comprising:
- code for causing the circuitry to determine whether reevaluation is needed based on one or more criteria; and
- code for causing the circuitry to determine whether a deficient performance occurs.

29. The computer-program product of claim 26, wherein the code for causing the circuitry to determine the next predistortion comprises:
- code for causing the circuitry to scale the power amplifier characteristic to determine a next power amplifier characteristic corresponding to the next bias voltage; and
- code for causing the circuitry to invert the next power amplifier characteristic.

30. An apparatus for reducing power consumption, comprising:
- means for capturing a transmit signal and a feedback signal concurrently;
- means for determining a minimum bias voltage for a power supply that enables a power amplifier to produce an amplified transmit signal in accordance with a requirement, wherein the means for determining the minimum bias voltage comprises means for determining a next predistortion corresponding to a next bias voltage in a set of voltages; and
- means for decreasing the current bias voltage if the next bias voltage and the next predistortion enable the power amplifier to produce the amplified transmit signal in accordance with the requirement.

31. The apparatus of claim 30, wherein the means for determining the minimum bias voltage comprises:
- means for determining a power amplifier characteristic corresponding to a current bias voltage, wherein the next bias voltage is lower than the current bias voltage; and
- means for estimating performance corresponding to the next bias voltage.

32. The apparatus of claim 31, further comprising:
- means for determining whether the next bias voltage and the next predistortion enable the power amplifier to produce the amplified transmit signal in accordance with the requirement; and
- means for setting at least one parameter if the next bias voltage and the next predistortion do not enable the power amplifier to produce the amplified transmit signal in accordance with the requirement.

33. The apparatus of claim 31, further comprising:
- means for determining whether reevaluation is needed based on one or more criteria; and
- means for determining whether a deficient performance occurs.

34. The apparatus of claim 31, wherein the means for determining the next predistortion comprises:
- means for scaling the power amplifier characteristic to determine a next power amplifier characteristic corresponding to the next bias voltage; and
- means for inverting the next power amplifier characteristic.

* * * * *